(12) United States Patent
Endo

(10) Patent No.: US 7,470,947 B2
(45) Date of Patent: Dec. 30, 2008

(54) SEMICONDUCTOR MEMORY AND FABRICATION METHOD FOR THE SAME

(75) Inventor: Masato Endo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 11/226,503

(22) Filed: Sep. 15, 2005

(65) Prior Publication Data

US 2006/0071266 A1    Apr. 6, 2006

(30) Foreign Application Priority Data

Oct. 4, 2004    (JP)    ............................ 2004-291658

(51) Int. Cl.
*H01L 27/108*    (2006.01)
*H01L 29/94*    (2006.01)

(52) U.S. Cl. ................. 257/298; 257/296; 257/321; 257/315; 257/316; 257/317; 438/201

(58) Field of Classification Search ............... 257/321, 257/315, 316, 317, 296, 298; 438/201
See application file for complete search history.

(56) References Cited

U.S. PATENT DOCUMENTS

| 5,994,733 | A  | * | 11/1999 | Nishioka et al. ............. 257/316 |
| 6,376,879 | B2 | * | 4/2002 | Mori et al. .................... 257/347 |
| 6,791,883 | B2 | * | 9/2004 | Swift et al. ............. 365/185.29 |
| 6,794,708 | B2 |   | 9/2004 | Mori |
| 6,841,444 | B2 | * | 1/2005 | Shimizu ....................... 438/257 |
| 2002/0093073 | A1 | * | 7/2002 | Mori et al. ................... 257/510 |
| 2004/0124477 | A1 | * | 7/2004 | Minami et al. ............... 257/379 |

FOREIGN PATENT DOCUMENTS

| JP | 2002-64157 | 2/2002 |
| JP | 2002-329793 | 11/2002 |

OTHER PUBLICATIONS

U.S. Appl. No. 11/226,503, filed Sep. 15, 2005, Endo.
U.S. Appl. No. 11/319,743, filed Dec. 29, 2005, Yaegashi.
Kyung-Joong Joo, et al., "A New Cobalt Polycide Technology for High Density NAND Flash Memories", 2001 NVSMW, Aug. 2001, pp. 64-66.

* cited by examiner

*Primary Examiner*—Michelle Estrada
*Assistant Examiner*—Jarrett J Stark
(74) *Attorney, Agent, or Firm*—Oblon, Spivak, McClelland, Maier & Neustadt, P.C.

(57) ABSTRACT

A semiconductor memory includes memory cell transistors comprising a tunnel insulating film, a floating gate electrode, a first insulating film, a control gate electrode, and a first metal salicide film; low-voltage transistors comprising a first p-type source region and a first p-type drain region, a first gate insulating film, and a first gate electrode of an n conductivity type having the same dose of a first p-type impurity as with the first p-type source region; and high-voltage transistors comprising a second p-type source region and a second p-type drain region, a second gate insulating film thicker than the first gate insulating film, and a second gate electrode of an n conductivity type having the same dose of a second p-type impurity as with the second p-type source region.

13 Claims, 31 Drawing Sheets

[HIGH-VOLTAGE CIRCUIT REGION]

[CELL REGION]

[LOW-VOLTAGE CIRCUIT REGION]

[LOW-VOLTAGE CIRCUIT REGION]

[HIGH-VOLTAGE CIRCUIT REGION]

[HIGH-VOLTAGE CIRCUIT REGION]

[LOW-VOLTAGE CIRCUIT REGION]

[CELL REGION]

[LOW-VOLTAGE CIRCUIT REGION]

[HIGH-VOLTAGE CIRCUIT REGION]

[LOW-VOLTAGE CIRCUIT REGION]

[CELL REGION]

[LOW-VOLTAGE CIRCUIT REGION]

[HIGH-VOLTAGE CIRCUIT REGION]

[LOW-VOLTAGE CIRCUIT REGION]

[CELL REGION]

[LOW-VOLTAGE CIRCUIT REGION]

[HIGH-VOLTAGE CIRCUIT REGION]

[LOW-VOLTAGE CIRCUIT REGION]

[CELL REGION]

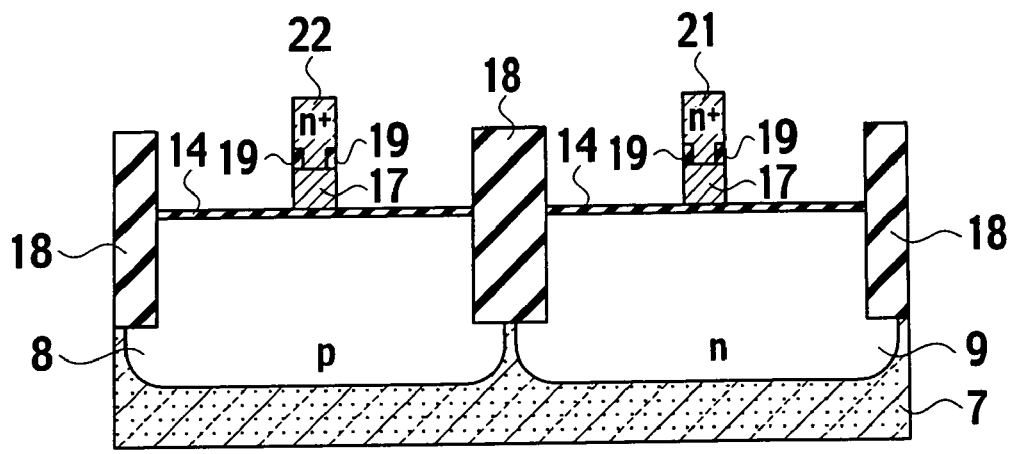
[LOW-VOLTAGE CIRCUIT REGION]
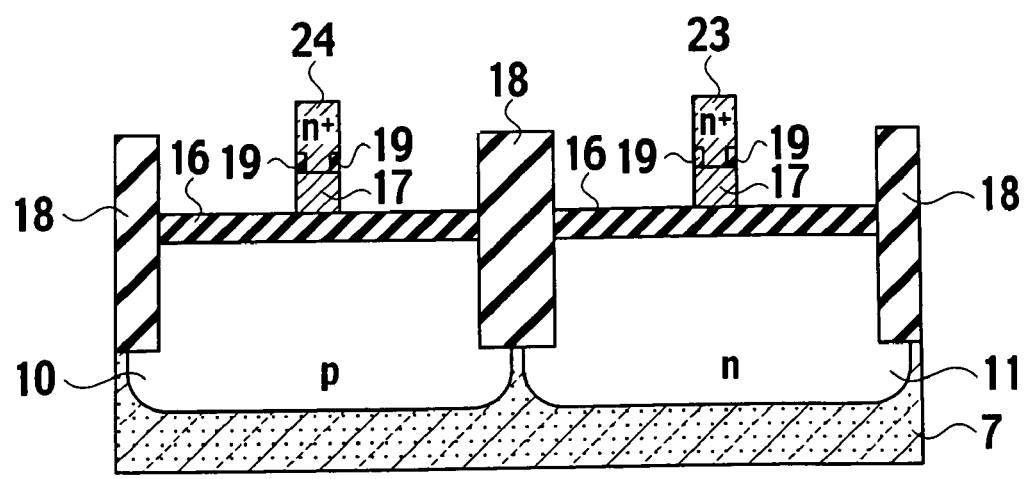
[HIGH-VOLTAGE CIRCUIT REGION]

[LOW-VOLTAGE CIRCUIT REGION]

[CELL REGION]

[LOW-VOLTAGE CIRCUIT REGION]

[HIGH-VOLTAGE CIRCUIT REGION]

[LOW-VOLTAGE CIRCUIT REGION]

[CELL REGION]

[LOW-VOLTAGE CIRCUIT REGION]

[HIGH-VOLTAGE CIRCUIT REGION]

[LOW-VOLTAGE CIRCUIT REGION]

[CELL REGION]

[HIGH-VOLTAGE CIRCUIT REGION]

[HIGH-VOLTAGE CIRCUIT REGION]

[LOW-VOLTAGE CIRCUIT REGION]

[LOW-VOLTAGE CIRCUIT REGION]

[LOW-VOLTAGE CIRCUIT REGION]

[LOW-VOLTAGE CIRCUIT REGION]

[LOW-VOLTAGE CIRCUIT REGION]

[HIGH-VOLTAGE CIRCUIT REGION]

[HIGH-VOLTAGE CIRCUIT REGION]

[LOW-VOLTAGE CIRCUIT REGION]

[CELL REGION]

SEMICONDUCTOR MEMORY AND FABRICATION METHOD FOR THE SAME

CROSS REFERENCE TO RELATED APPLICATIONS AND INCORPORATION BY REFERENCE

This application is based upon and claims the benefit of priority from the prior Japanese Patent Applications No. P2004-291658, filed on Oct. 4, 2004; the entire contents of which are incorporated herein by reference.

BACKGROUND OF THE INVENTION

1. Field of the Invention

The present invention relates to a structure of a semiconductor memory having floating gate electrodes, and a fabrication method for the same.

2. Description of the Related Art

A nonvolatile semiconductor memory, such as electronically erasable and programmable read-only memory (EEPROM), for example, is well-known as a conventional semiconductor memory.

The nonvolatile semiconductor memory is fabricated on a semiconductor substrate including a cell array region, low-voltage circuit regions adjacent to the cell array region, and high-voltage circuit regions adjacent to the cell array region and the low-voltage circuit regions.

Memory cell transistors are deployed in the cell array region, low-voltage transistors are deployed in the low-voltage circuit regions, and high-voltage transistors are deployed in the high-voltage circuit regions.

In fabrication of the nonvolatile semiconductor memory, a conductive film used for gate electrodes of the low-voltage transistors and the high-voltage (20 V or greater) transistors is formed before a device isolating film. Another conductive film and an ion-implantation prevention film are then formed on the conductive film for gate electrodes of the low-voltage transistors and the high-voltage transistors. The ion-implantation prevention film prevents impurity ions from being implanted in the gate electrodes during ion implantation for formation of source and drain regions.

Due to this ion-implantation prevention film, there is an increased burden on the mask material in the etching process for formation of the gate electrodes of the memory cell transistors, the low-voltage transistors, and the high-voltage transistors. Control of a tapering angle of the gate electrodes may be difficult due to this tendency. Embedding insulating films between the gate electrodes also may be difficult.

BRIEF SUMMARY OF THE INVENTION

An aspect of the present invention inheres in a semiconductor memory including: a semiconductor substrate; memory cell transistors disposed on the semiconductor substrate, each memory cell transistor including: a tunnel insulating film on the semiconductor substrate and in contact with a device isolating film, a floating gate electrode on the tunnel insulating film, a first insulating film on the floating gate electrode, a control gate electrode on the first insulating film, and a first metal salicide film on the control gate electrode; and a transistor disposed on the semiconductor substrate, the transistor including: a first source region of a first conductive type and a first drain region of the first conductivity type surrounded by the device isolating film, a first gate insulating film between the first source region and the first drain region, and a first gate electrode of a second conductivity type provided on the first gate insulating film and having the same dose of the first conductivity type impurity as the first source region.

Another aspect of the present invention inheres in a semiconductor memory including: a semiconductor substrate; memory cell transistors disposed on the semiconductor substrate, each memory cell transistor including: a tunnel insulating film on the semiconductor substrate and in contact with a device isolating film, a floating gate electrode on the tunnel insulating film, a first insulating film on the floating gate electrode, a control gate electrode on the first insulating film, and a first metal salicide film on the control gate electrode; and transistors disposed in a circuit region, each transistor including: a first source region and a first drain region surrounded by a device isolating film, a first gate insulating film between the first source region and the first drain region, a first conductive film on the first gate insulating film, a second insulating film provided on the first conductive film and having a first trench penetrating the second insulating film, a second conductive film on the first conductive film and the second insulating film, and a second metal salicide film on the second conductive film.

Still another aspect of the present invention inheres in a method for fabricating a semiconductor memory including: forming a tunnel insulating film for a memory cell transistor, a first gate insulating film for a low-voltage transistor, and a second gate insulating film for a high-voltage transistor on a semiconductor substrate; forming a first n-type semiconductor film, which becomes a floating gate electrode of the memory cell transistor and a part of gate electrodes of the low-voltage transistor and the high-voltage transistor, on the tunnel insulating film, the first gate insulating film, and the second gate insulating film; forming a first insulating film, as an inter-layer insulating film for the memory cell transistor, on the first n-type semiconductor film; removing the first insulating film on the first n-type semiconductor film in areas in which gate electrodes of the low-voltage transistor and the high-voltage transistor are positioned, so as to expose the first n-type semiconductor film; forming a second n-type semiconductor film, which becomes a control gate electrode of the memory cell transistor and a part of gate electrodes of the low-voltage transistor and the high-voltage transistor, on the exposed first semiconductor film, and the first insulating film; delineating the floating gate electrode and the control gate electrode of the memory cell transistor, and the gate electrodes of the low-voltage transistor and the high-voltage transistor; and implanting a second p-type impurity in the second n-type semiconductor film so that a concentration thereof is lower than that of an n-type impurity, using the control gate electrode of the memory cell transistor and the gate electrodes of the low-voltage transistor and the high-voltage transistor as a mask, so as to form source and drain regions of a p conductivity type in the semiconductor substrate.

BRIEF DESCRIPTION OF THE DRAWINGS

FIGS. 12A through 17A are cross sections of the transistors in a low-voltage circuit region of the nonvolatile semiconductor memory mid-fabrication (1 of 4);

FIGS. 12B through 17B are cross sections of the transistors in a high-voltage circuit region of the nonvolatile semiconductor memory mid-fabrication (2 of 4);

FIGS. 12C through 17C are cross sections of the resistors in a low-voltage circuit region of the nonvolatile semiconductor memory mid-fabrication (3 of 4);

FIGS. 12D through 17D are cross sections of the cell array region of the nonvolatile semiconductor memory mid-fabrication (4 of 4);

DETAILED DESCRIPTION OF THE INVENTION

Figure 1:
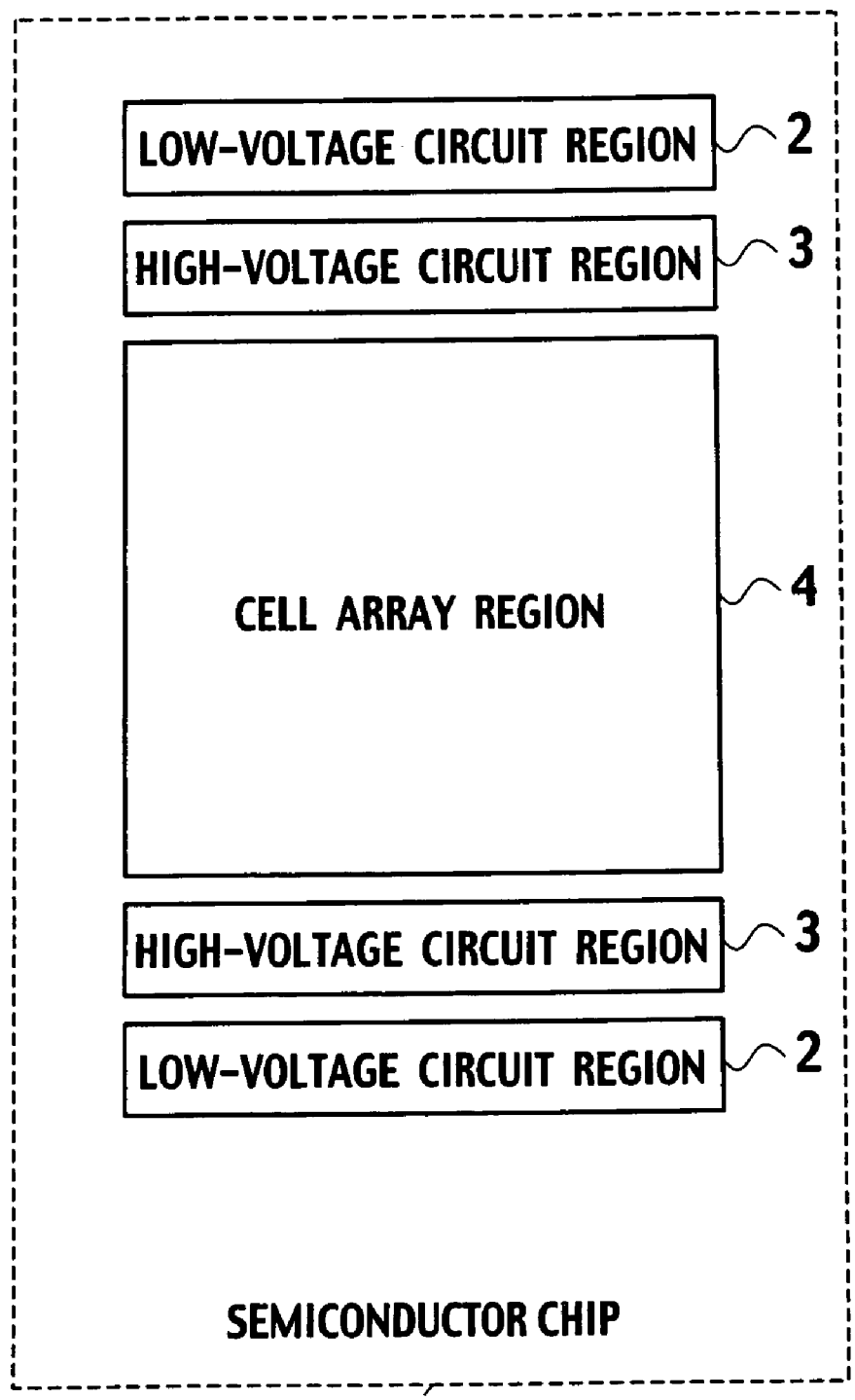
FIG. 1 shows a layout of a nonvolatile semiconductor memory, according to a first embodiment.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

The nonvolatile semiconductor memory of the first embodiment is provided as a semiconductor chip 1 or a part thereof, as shown in FIG. 1. The nonvolatile semiconductor memory of the first embodiment comprises a cell array region 4, low-voltage circuit regions 2 adjacent to the cell array region 4, and high-voltage circuit regions 3 adjacent to the cell array region 4 and the low-voltage circuit regions 2. Memory cell transistors are deployed in the cell array region 4. Low-voltage transistors and resistors are deployed in the respective low-voltage circuit regions 2. High-voltage transistors are deployed in the respective high-voltage circuit regions 3. Relatively higher voltage pulses are applied to the high-voltage circuit regions 3 than power-supply voltages, such as a write-in voltage Vpgm and an erase voltage Verase to be applied to the cell array region 4. The low-voltage circuit regions 2 are logic circuits such as a CMOS and are necessary for a relatively high-speed, low-power consumption performance.

An electronically erasable and programmable read-only memory (EEPROM), for example, may be the semiconductor memory of the first embodiment. More specifically, a NAND EEPROM, AND EEPROM, NOR EEPROM or the like is available as the semiconductor memory of the first embodiment.

Figure 2:
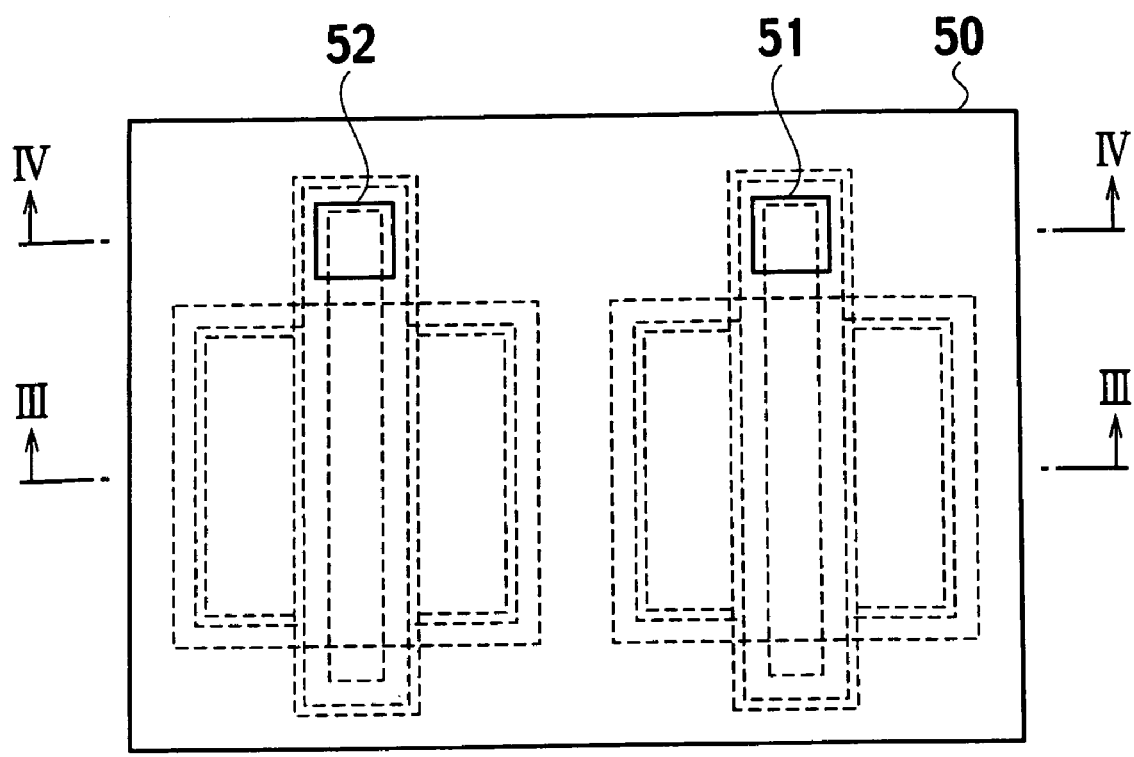
FIG. 2 is a top view of transistors in a low-voltage circuit region of the nonvolatile semiconductor memory, according to the first embodiment.
Figure 3:
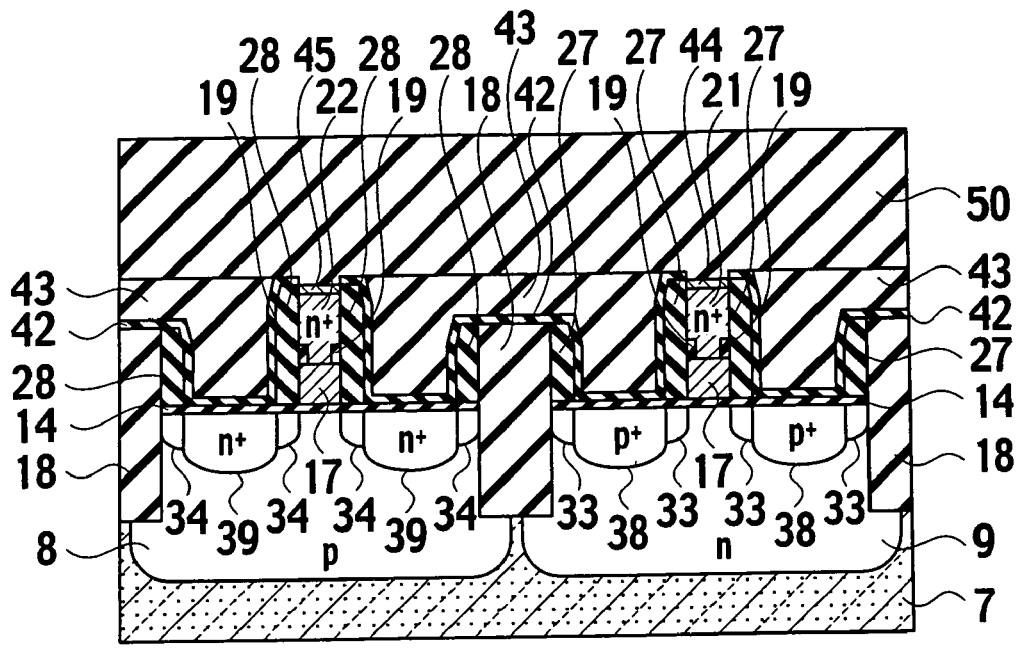
FIG. 3 is a cross section cut along a line III-III in FIG. 2.
Figure 4:
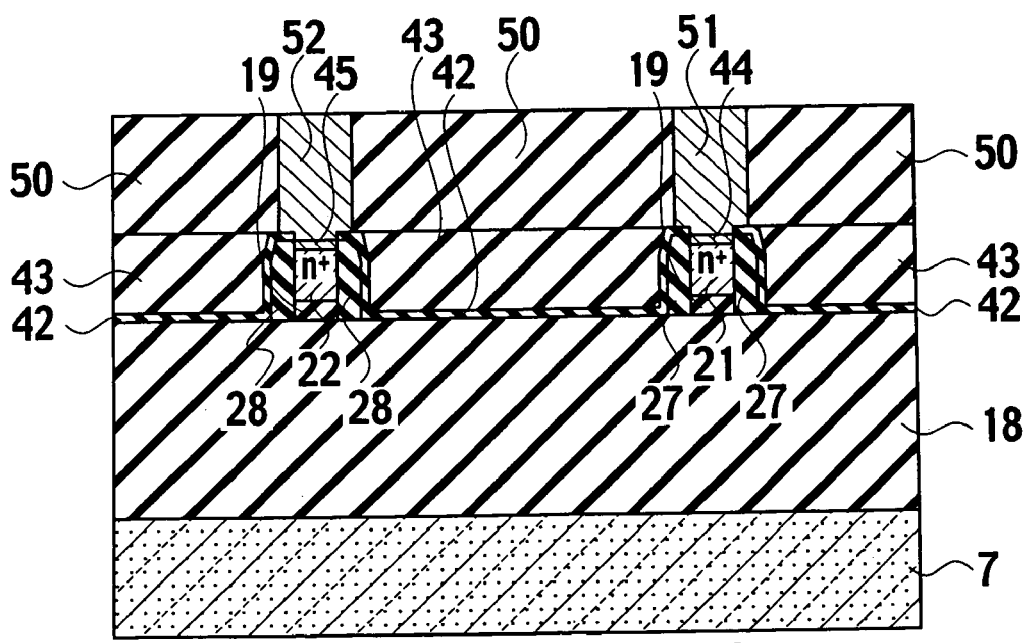
FIG. 4 is a cross section cut along a line IV-IV in FIG. 2.

FIGS. 2 through 4 show low-voltage transistors: a low-voltage n-channel MIS transistor and a low-voltage p-channel MIS transistor in the low-voltage circuit region 2. A CMOS may be comprised of the low-voltage n-channel MIS transistor and the low-voltage p-channel MIS transistor. The low-voltage n-channel MIS transistor and the low-voltage p-channel MIS transistor are surrounded by a device isolating film 18.

The low-voltage n-channel MIS transistor comprises a p-well 8, n-type light doping regions 34 surrounded by the p-well 8, and an n-type source region 39 and an n-type drain region 39 surrounded by the n-type light doping regions 34 in a semiconductor substrate 7. Furthermore, the low voltage n-channel MIS transistor comprises: a low-voltage gate insulating film 14 provided on the semiconductor substrate 7; a conductive film 17 provided on the low-voltage gate insulating film 14; an insulating film 19, including a trench passing therethrough, provided on the conductive film 17; a conductive film 22 provided on the conductive film 17, the insulating film 19, and the device isolating film 18; a metal salicide film 45 provided on the conductive film 22; insulating films 28 provided above the n-type light doping regions 34 and on sides of the conductive films 17 and 22 and the device isolating film 18; a protective insulator film 42 deployed above the n-type source region 39 and the n-type drain region 39 and having openings on the entire surface of the metal salicide film 45; an insulating film 43 provided on the protective insulator film 42; a contact plug 52 provided above the device isolating film 18 and the conductive film 22; and an insulating film 50 provided on the insulating film 43 and the metal salicide film 45 and arranged around the contact plug 52.

The low-voltage p-channel MIS transistor comprises an n-well 9 in the semiconductor substrate 7, p-type light doping regions 33 surrounded by the n-well 9, and a p-type source region 38 and a p-type drain region 38 surrounded by the p-type light doping regions 33. Furthermore, the low-voltage p-channel MIS transistor comprises: a low-voltage gate insulating film 14 provided on the semiconductor substrate 7; a conductive film 17 provided on the low-voltage gate insulating film 14; an insulating film 19 configured to comprise a trench passing therethrough provided on the conductive film 17; a conductive film 21 of an n conductivity type provided on the conductive film 17, the insulating film 19, and the device isolating film 18 and having the same dose of a p-type impurity as the upper surface of the p-type source region 38; a metal salicide film 44 provided on the conductive film 21; insulating films 27 provided above the p-type light doping regions 33 and on sides of the conductive films 17 and 21 and the device isolating film 18; a protective insulator film 42 deployed above the p-type source region 38 and the p-type drain region 38 and having openings on the entire surface of the metal salicide film 44; an insulating film 43 provided on the protective insulator film 42; a contact plug 51 provided above the device isolating film 18 and the conductive film 22; and an insulating film 50 provided on the insulating film 43 and the metal salicide film 44 and arranged around the contact plug 51. The conductive films 17, 21, and 22 are made of polysilicon. It is preferable that the element of the p-type impurity included in the conductive film 21 be boron (B). The metal salicide films 44 and 45 are titanium silicide films, cobalt silicide films, or nickel silicide films.

Figure 5:
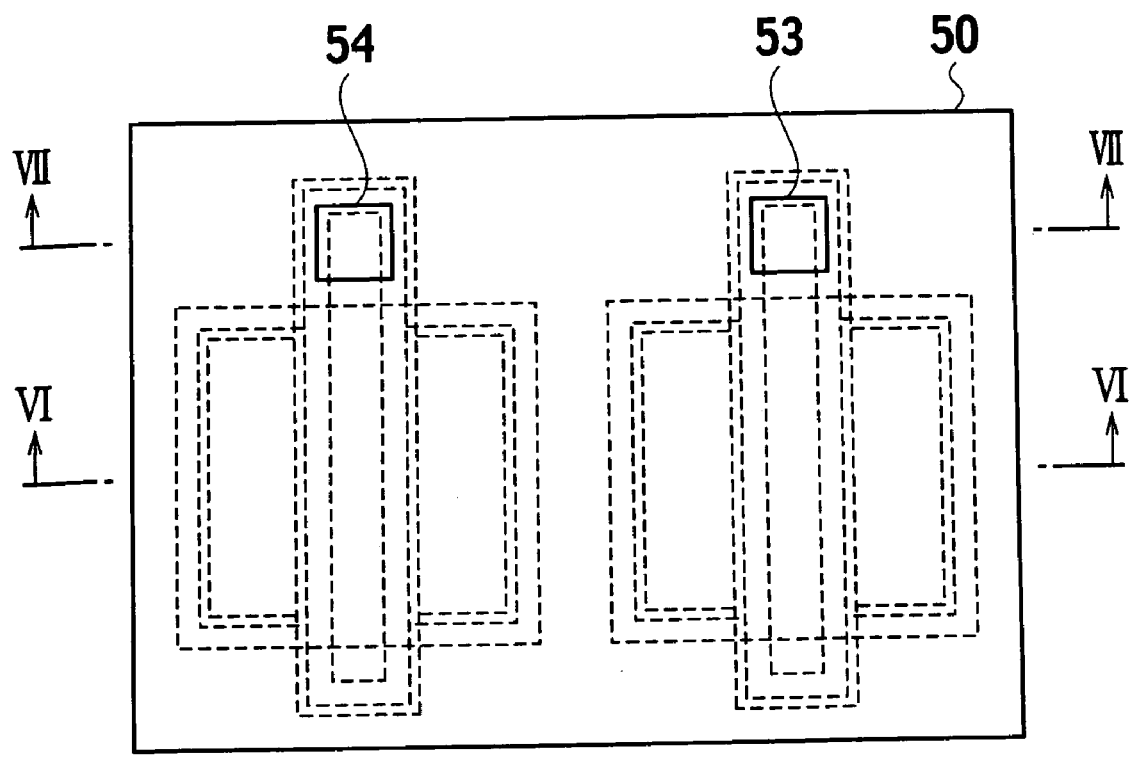
FIG. 5 is a top view of transistors in a high-voltage circuit region of the nonvolatile semiconductor memory, according to the first embodiment.
Figure 6:
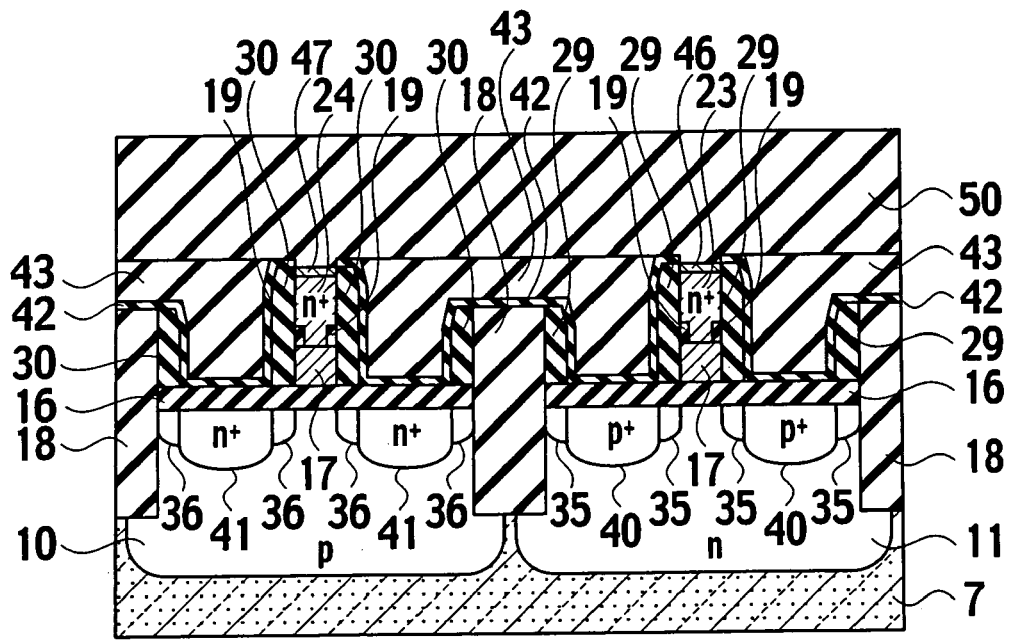
FIG. 6 is a cross section cut along a line VI-VI in FIG. 5.
Figure 7:
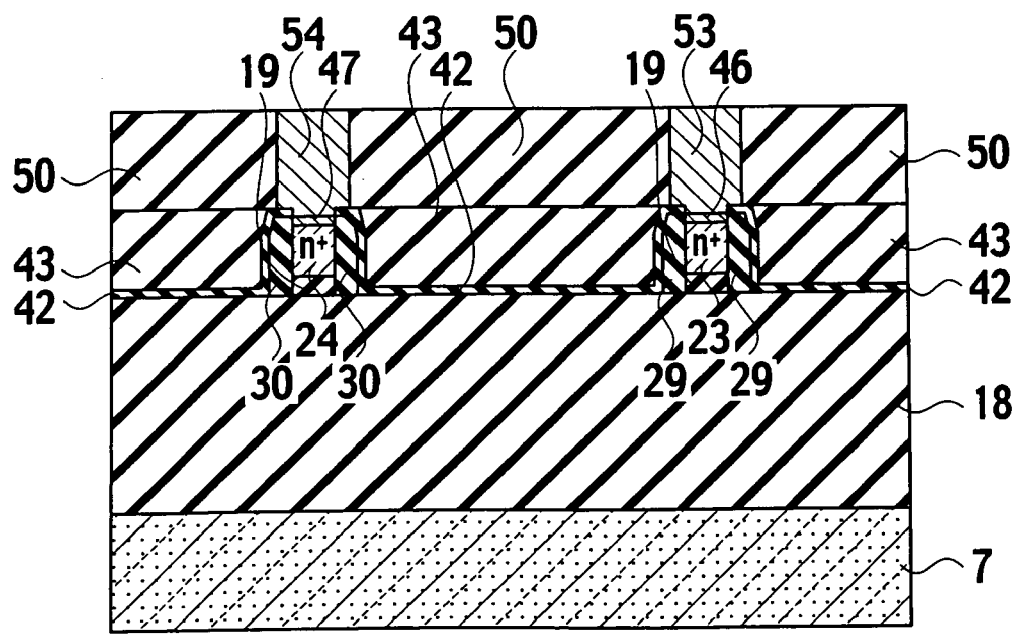
FIG. 7 is a cross section cut along a line VII-VII in FIG. 5.

FIGS. 5 through 7 show the high-voltage transistors: a high-voltage n-channel MIS transistor and a high voltage p-channel MIS transistor in the high-voltage circuit regions 3. The high-voltage n-channel MIS transistor and the high-voltage p-channel MIS transistor may comprise a CMOS. The high-voltage n-channel MIS transistor and the high-voltage p-channel MIS transistor are surrounded by the device isolating film 18.

The high-voltage n-channel MIS transistor comprises a p-well 10, n-type light doping regions 36 surrounded by the p-well 10, and an n-type source region 41 and an n-type drain region 41 surrounded by the n-type light doping regions 36 in the semiconductor substrate 7. Furthermore, the high-voltage n-channel MIS transistor comprises: a high-voltage gate insulating film 16 provided on the semiconductor substrate 7 and having a thicker oxidized silicon film thickness, when converted to the thickness of a silicon oxide film, than that of the low-voltage gate insulating film 14 and that of a tunnel insulating film 15 of the memory cell transistor, when both respective films 14, 15 are converted to the thickness of a silicon oxide film; a conductive film 17 provided on the low-voltage gate insulating film 16; an insulating film 19 provided on the conductive film 17 and having a trench passing therethrough; a conductive film 24 provided on the conductive film 17, the insulating film 19, and the device isolating film 18; a metal salicide film 47 provided on the conductive film 24; insulating films 30 provided above the n-type light doping regions 36 and on sidewalls of the conductive films 17 and 24 and the device isolating film 18; a protective insulator film 42 deployed above the n-type source region 41 and the n-type drain region 41, and having openings on the entire surface of the metal salicide film 47; an insulating film 43 provided on the protective insulator film 42; a contact plug 54 provided above the device isolating film 18 and the conductive film 24; and an insulating film 50 provided on the insulating film 43 and the metal salicide film 47 and arranged around the contact plug 54. Note that the thickness of the film, when converted to the oxidized silicon film thickness, is obtained by multiplying the relative permittivity of a silicon oxide film by the thickness of a target insulating film and then dividing by the relative permittivity of the target insulating film.

The high-voltage p-channel MIS transistor comprises an n-well 11, p-type light doping regions 35 surrounded by the n-well 11, and a p-type source region 40 and a p-type drain region 40 surrounded by the p-type light doping regions 35 in the semiconductor substrate 7. Furthermore, the low-voltage p-channel MIS transistor comprises a high-voltage gate insulating film 16 provided on the semiconductor substrate 7 and having a thicker oxidized silicon film thickness, when converted to the thickness of a silicon oxide film than that of the low-voltage gate insulating film 14 and that of a tunnel insulating film 15 of the memory cell transistor when both respective film 14, 15 are converted to the thickness of a silicon oxide film; a conductive film 17 provided on the high-voltage gate insulating film 16; an insulating film 19 having a trench passing therethrough provided on the conductive film 17; a conductive film 23 of an n conductivity type provided on the conductive film 17, the insulating film 19, and the device isolating film 18 and having the same dose of a p-type impurity as the upper surface of the p-type source region 40; a metal salicide film 46 provided on the conductive film 23; an insulating film 29 provided above the p-type light doping regions 35 and on sidewalls of the conductive films 17 and 23 and the device isolating film 18; a protective insulator film 42 deployed above the p-type source region 40 and the p-type drain region 40 and having openings on the entire surface of the metal salicide film 46; an insulating film 43 provided on the protective insulator film 42; a contact plug 53 provided above the device isolating film 18 and the conductive film 23; and an insulating film 50 provided on the insulating film 43 and the metal salicide film 46, and arranged around the contact plug 53. The conductive films 17, 23, and 24 are made of polysilicon. The metal salicide films 46 and 47 are titanium silicide films, cobalt silicide films, or nickel silicide films.

Figure 8:
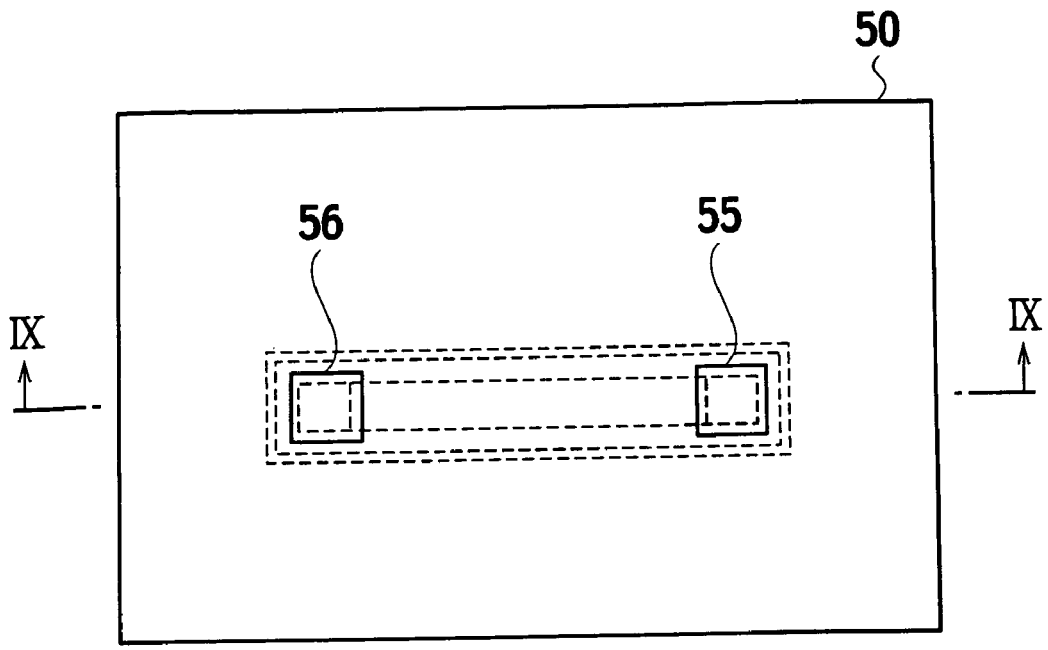
FIG. 8 is a top view of resistors in a low-voltage circuit region of the nonvolatile semiconductor memory, according to the first embodiment.
Figure 9:
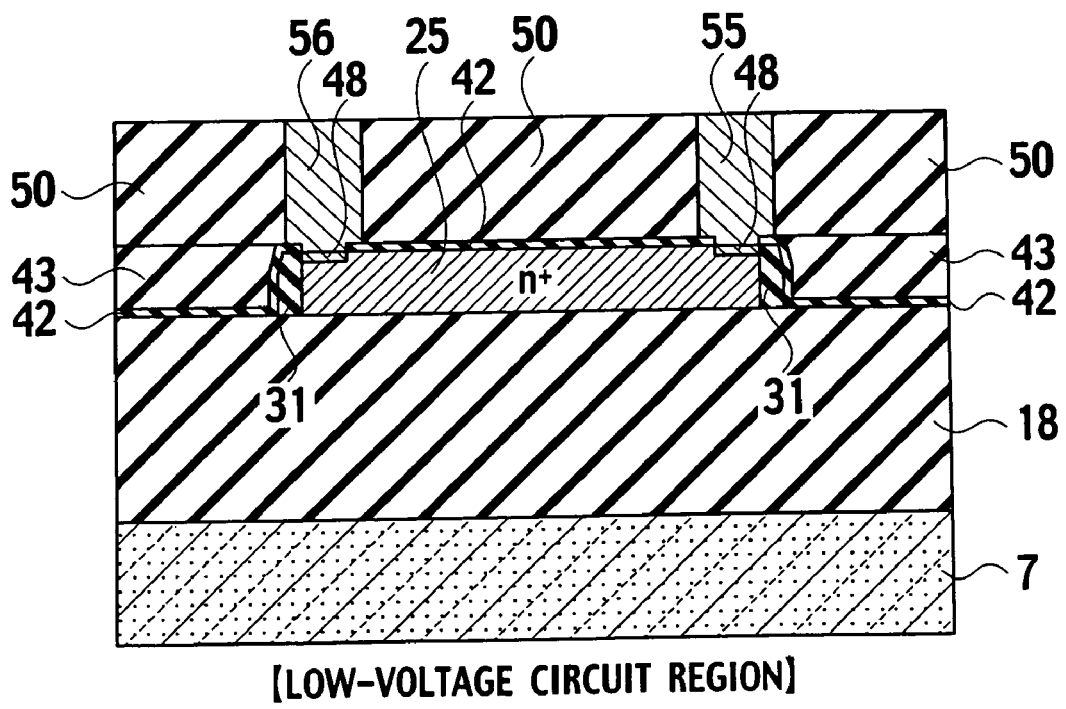
FIG. 9 is a cross section cut along a line IX-IX in FIG. 8.

As shown in FIGS. 8 and 9, the resistors in the low-voltage circuit regions 2 are provided on the device isolating films 18. Each resistor includes a conductive film 25 provided on the device isolating films 18, insulating films 31 provided on sidewalls of the conductive film 25, metal salicide films 48 provided on the conductive film 25, the protective insulating film 42 deployed above the device isolating film 18, the insulating films 31, and the conductive film 25, and having openings on the entire surface of the metal salicide films 48, the insulating film 43 provided on the protective insulator film 42, the contact plugs 55 and 56 provided on the metal salicide films 48, and the insulting film 50 provided on the insulating film 43 and arranged surrounding the contact plug 52. The conductive film 25 is made of polysilicon. The metal salicide film 48 is a titanium silicide film, a cobalt silicide film, or a nickel silicide film.

Figure 10:
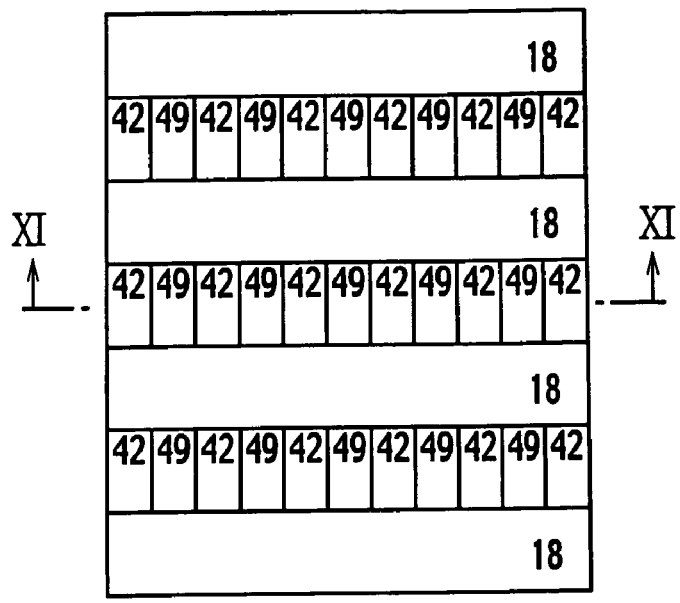
FIG. 10 is a top view of a cell array region of the nonvolatile semiconductor memory, according to the first embodiment.
Figure 11:
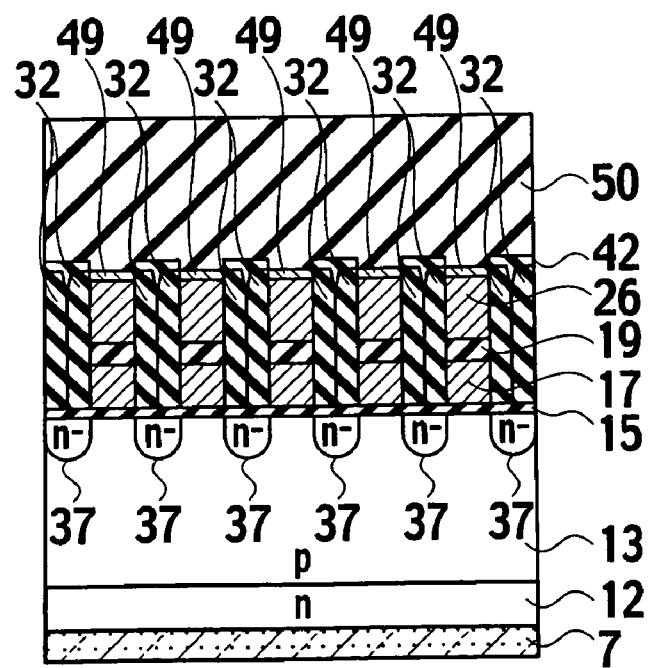
FIG. 11 is a cross section cut along a line XI-XI in FIG. 10.

As shown in FIGS. 10 and 11, the memory cell transistors in the cell array region 4 are arranged between the device isolating films 18. Each memory cell transistor comprises an n-well 12, a p-well 13 surrounded by the n-well 12, and a light doping region 27 surrounded by the p-well 13 in the semiconductor substrate 7. Furthermore, the memory cell transistor comprises the tunnel insulating film 15 in contact with a device isolating film 18 provided on the semiconductor substrate 7, a floating gate electrode 17 provided on the tunnel insulating film 15, the insulting film 19 provided on the floating gate electrode 17, a control gate electrode 26 provided on the insulating film 19, a metal salicide film 49 deployed on the control gate electrode 26, an insulating film 32 provided on sidewalls of the floating gate electrode 17, the insulating film 19, the control gate electrode 26, and the device isolating film 18, the protective insulating film 42 arranged on the device isolating film 18, having an opening on the entire surface of the metal salicide film 49, and the insulating film 50 provided on the protective insulating film 42. The floating gate electrode 17 and the control gate electrode 26 are made of polysilicon. The metal salicide film 49 is either a titanium silicide film, a cobalt silicide film, or a nickel silicide film.

A nonvolatile semiconductor memory fabrication method according to the first embodiment is described forthwith.

Figure 12A:
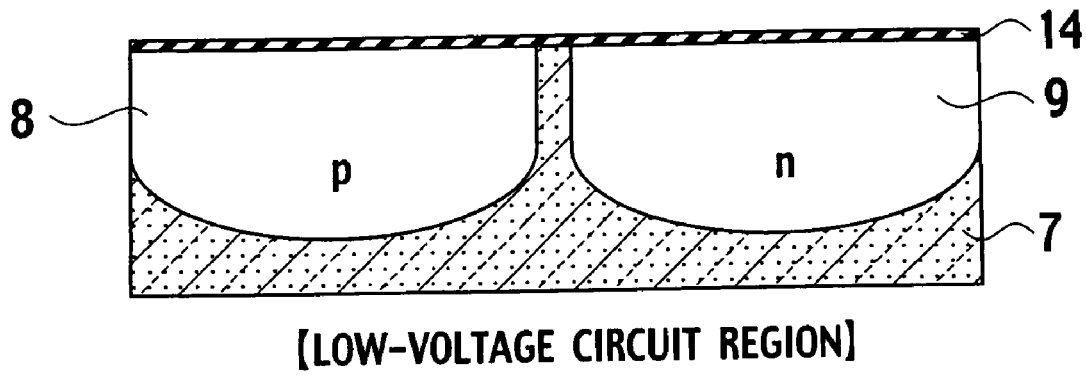
Figure 12B:
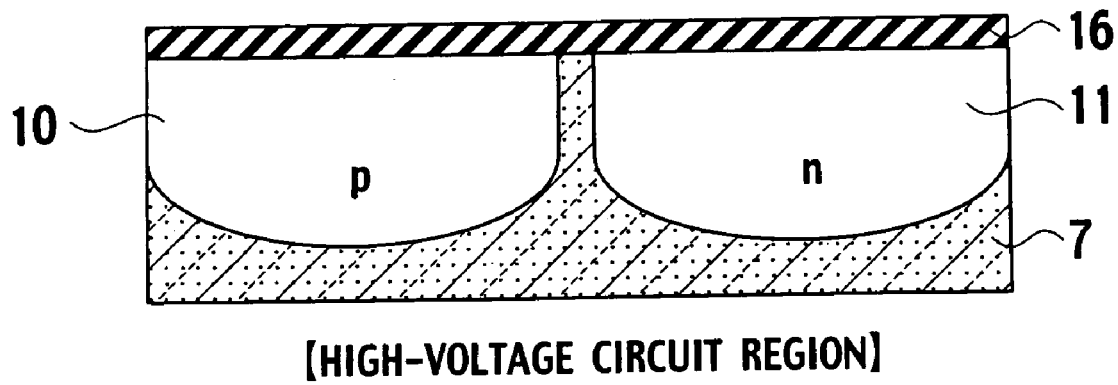

Firstly, as shown in FIG. 12A, the p-well 8 and the n-well 9 are formed in a low-voltage circuit region of the semiconductor substrate 7. As shown in FIG. 12B, the p-well 10 and the n-well 11 are formed in a high-voltage circuit region of the semiconductor substrate 7. As shown in FIG. 12D, the n-well 12 and the p-well 13 are formed in a cell region of the semiconductor substrate 7.

Figure 12C:
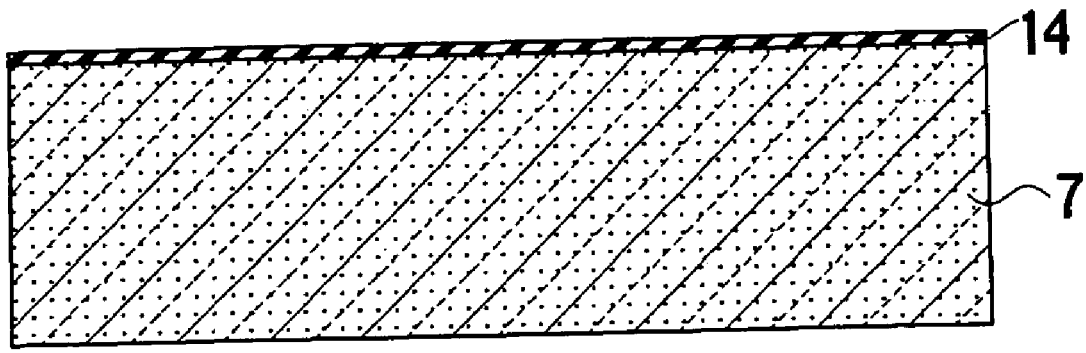
Figure 12D:
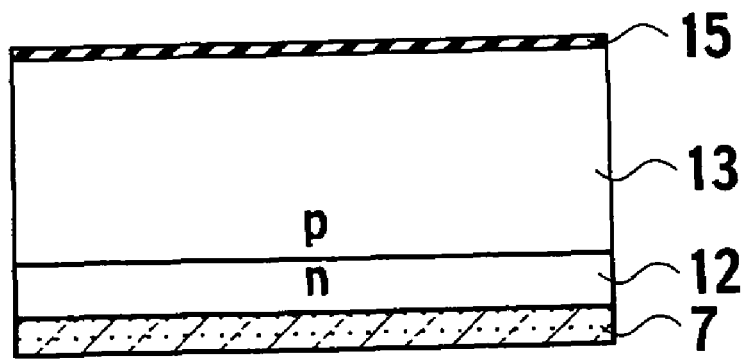

As shown in FIGS. 12A and 12C, the low-voltage gate insulating film 14 of a low-voltage transistor is formed in the low-voltage circuit region of the semiconductor substrate 7. As shown in FIG. 12B, the high-voltage gate insulating film 16 of a high-voltage transistor is formed in the high-voltage circuit region of the semiconductor substrate 7. As shown in FIG. 12D, the tunnel insulating film 15 of the memory cell transistor is formed in the cell region of the semiconductor substrate 7.

Figure 13A:
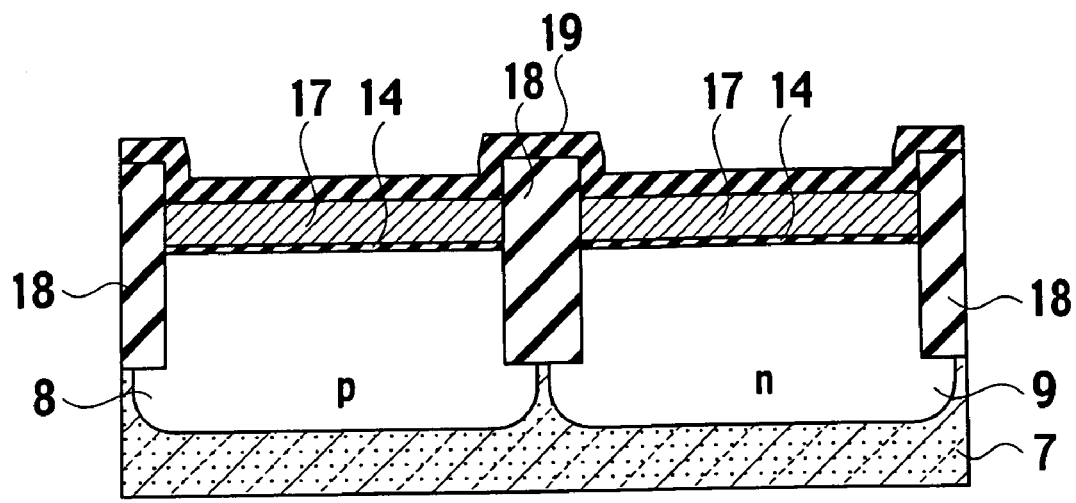
Figure 13B:
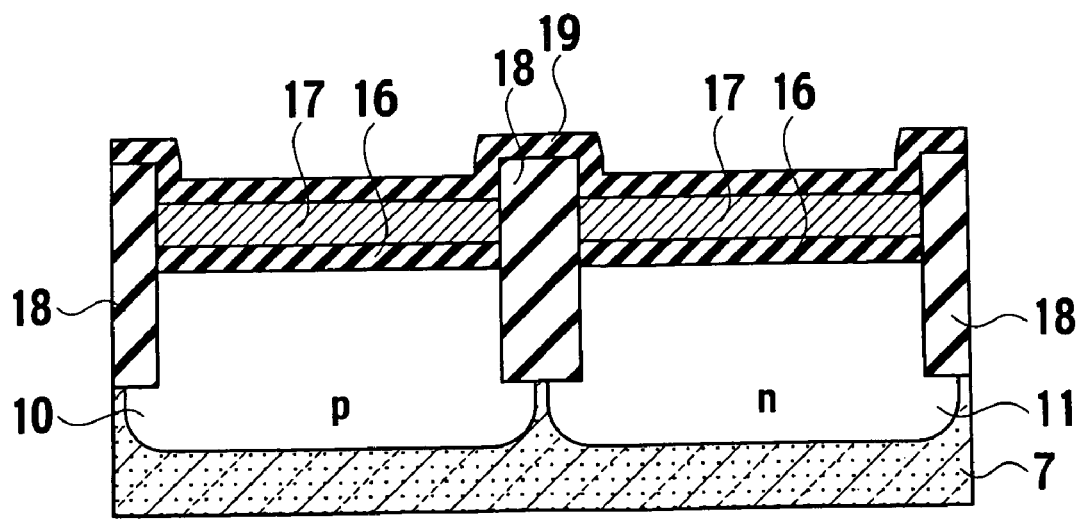
Figure 13C:
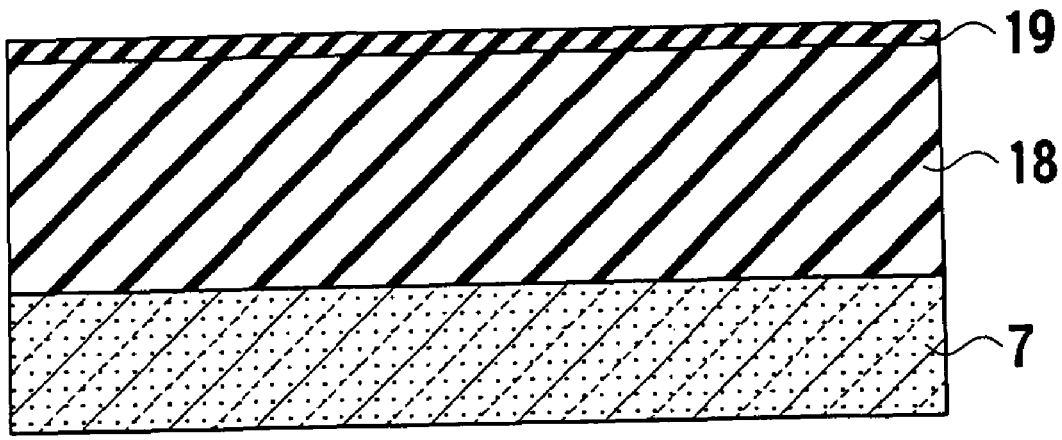
Figure 13D:
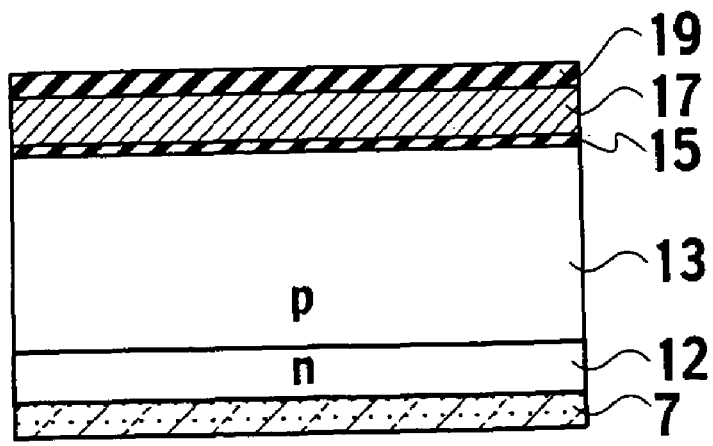

As shown in FIGS. 13A, 13B, and 13D, an n-type semiconductor film 17, which becomes a floating gate electrode of the memory cell transistor and a part of gate electrodes of the low-voltage transistor and the high-voltage transistor, is formed on the tunnel insulating film 15, the low-voltage gate insulating film 14, and the high voltage gate insulating film 16. As shown in FIG. 13C, once the n-type semiconductor film 17 is formed, it is removed from an area in which the resistor of the low-voltage circuit region is formed.

As shown in FIGS. 13A, 13B, and 13D, the device isolating film 18 is embedded in the semiconductor substrate 7 in the periphery of the memory cell transistor, the low-voltage transistor, and the high-voltage transistor is formed. As shown in FIG. 13C, the device isolating film 18 embedded in the semiconductor substrate 7 is also removed from an area in which the resistor of the low-voltage circuit region is formed. The insulating film 19, which is used as an inter-layer insulator film of the memory cell transistor, is formed on the n-type semiconductor film 17 and the device isolating film 18.

Figure 14A:
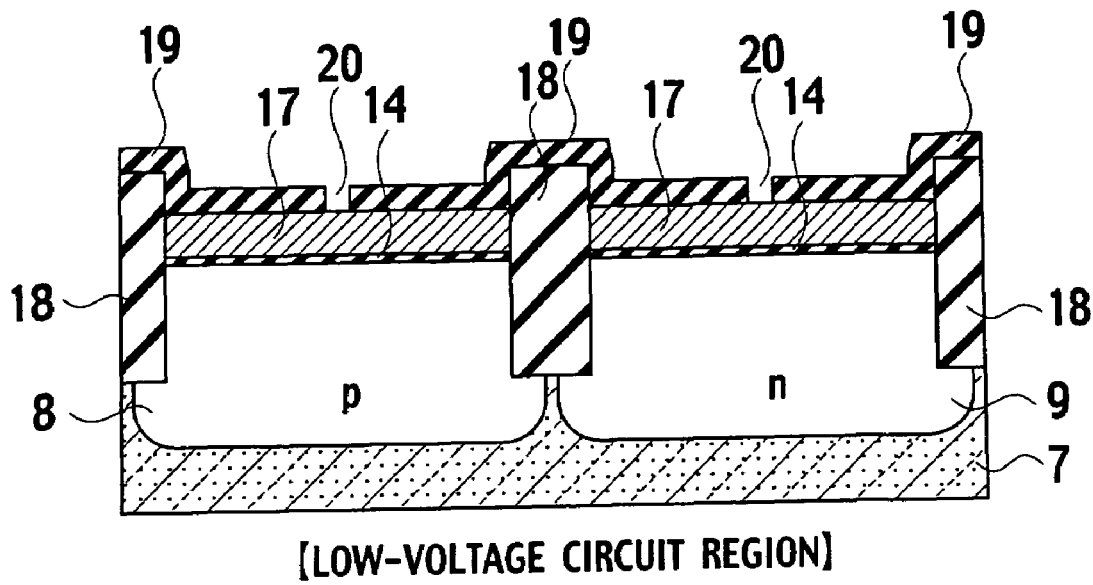
Figure 14B:
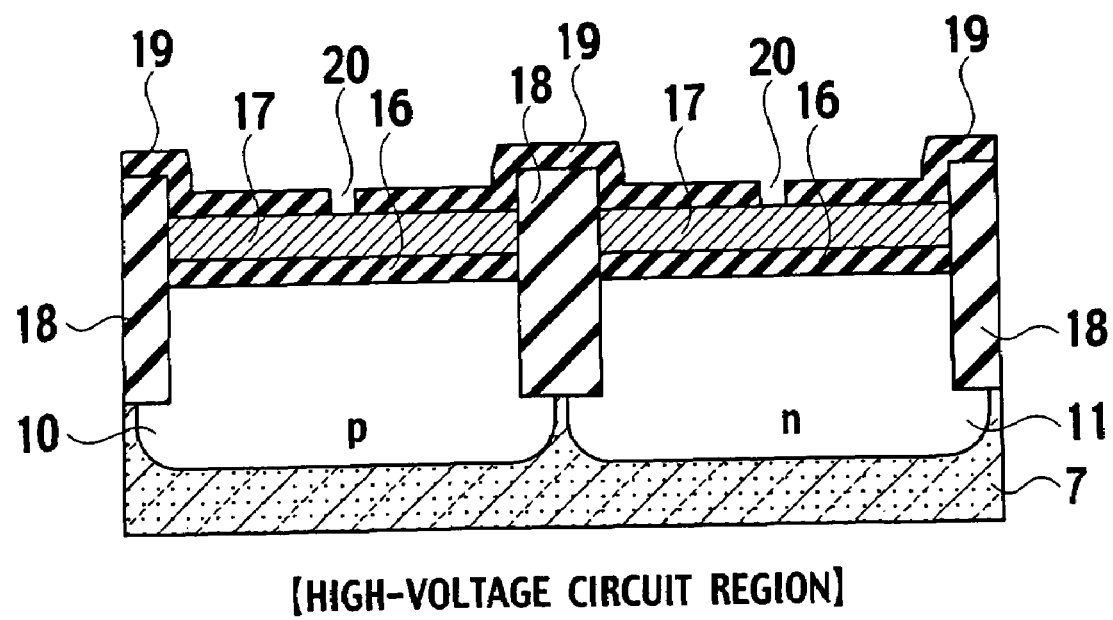
Figure 14C:
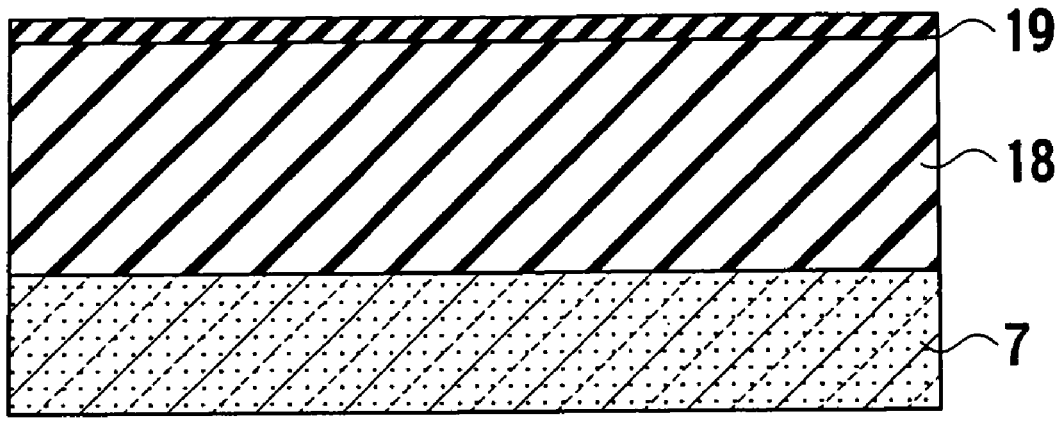
Figure 14D:
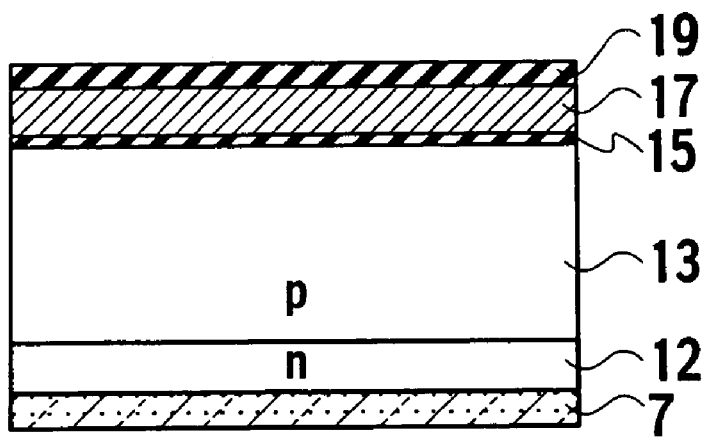
Figure 15C:
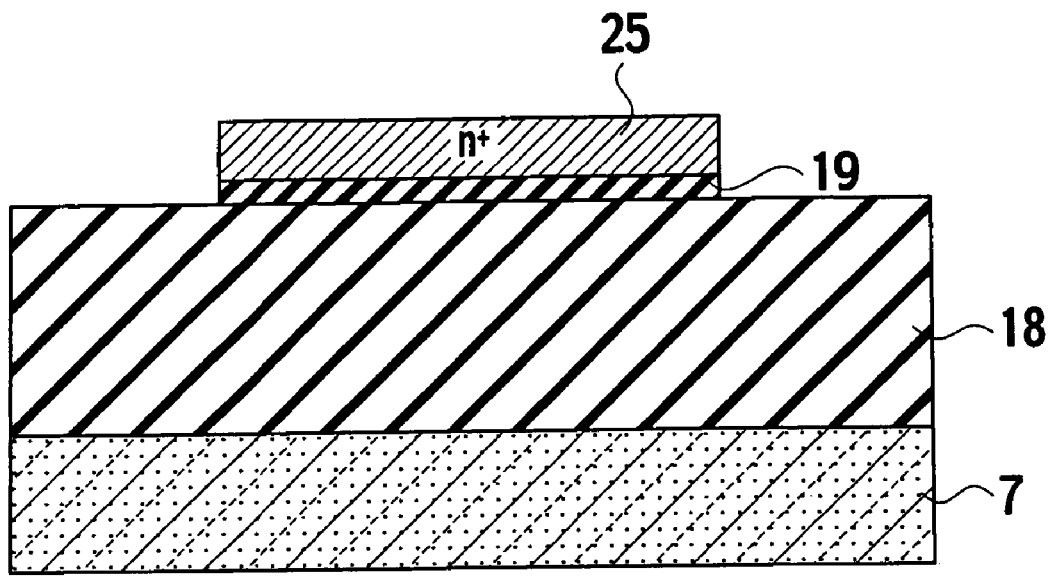
Figure 15D:
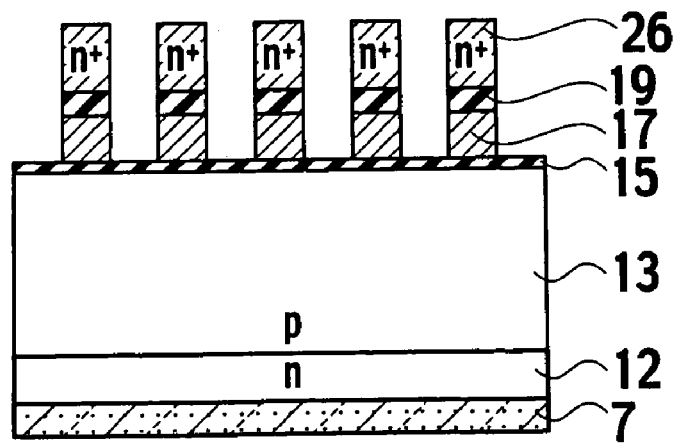

As shown in FIGS. 14A and 14B, a part of the insulating films 19 is removed. The insulating film 19 on the n-type semiconductor film 17 is removed from positions of the gate electrodes of the low-voltage transistor and the high-voltage transistor, thereby forming trenches 20 passing through the insulating film 19. The width of the trenches 20 is narrower than that of the gate electrodes. The n-type semiconductor film 17 is exposed. As shown in FIG. 14C, the insulating film 19 remains in the area in which the resistor of the low-voltage circuit region is formed without being removed. As shown in FIG. 14D, the insulating film 19 is not removed from the position of the memory cell transistor.

As shown in FIGS. 15A through 15D, n-type semiconductor films 21 through 26, which become the control gate electrode 26 of the memory cell transistor and a part of the gate electrodes of the low-voltage transistor and the high-voltage transistor, are formed on the low-voltage gate insulating film 17, the insulating film 19, and the device isolating film 18. Once non-doped semiconductor films are formed for the n-type semiconductor films 21 through 26, they are implanted with n-type impurity ions. A dose of the n-type impurity is $1 \times 10^{20}$ atm/cm$^2$ or greater. Note that a uniform concentration distribution of the n-type impurity in the control gate electrode 26 of the cell is preferred.

The n-type semiconductor films 21 through 24 are electrically connected to the n-type semiconductor film 17 via the trenches 20. Since gate electrodes are formed from the n-type semiconductor films 21 through 24 and the n-type semiconductor film 17, resistive components of the gate electrodes may be reduced. Note that since resistive components of the gate electrodes may be reduced even if the insulating film 19 does not exist in the gate electrode after the gate electrode is formed, width of the trenches 20 may be made wider than that of the gate electrodes, and further, the insulating film 19 may be removed from the entirety of the low-voltage circuit region and the high-voltage circuit region. In contrast, etching for formation of the gate electrodes of the low-voltage transistor, the high-voltage transistor, and the memory cell transistor, while leaving the insulating film 19 in the gate electrodes, provides the same thickness of the low-voltage circuit region, the high-voltage circuit region, and the cell region, thereby facilitating the etching process. As such, the n-type semiconductor films 17 and 21 through 24 and the insulating film 19 are formed in the shapes of the gate electrodes of the low-voltage transistor and the high-voltage transistor through lithography and etching. The n-type semiconductor film 25 is formed in the shape of the resistor. The n-type semiconductor films 17 and 26 and the insulating film 19 are formed in the shapes of the floating gate electrode of the memory cell transistor, the control gate electrode 26, and the inter-layer insulating film, respectively.

Figure 16A:
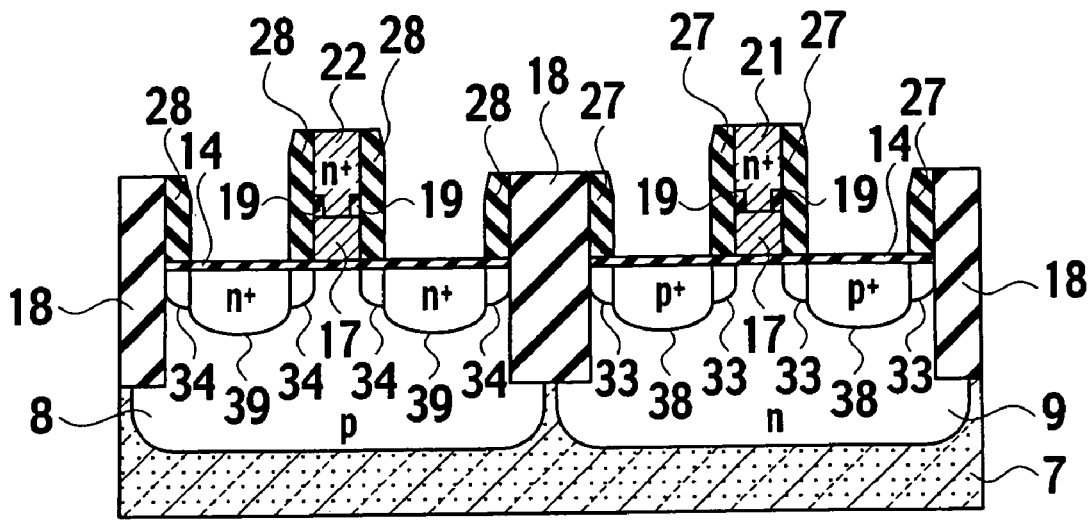
Figure 16B:
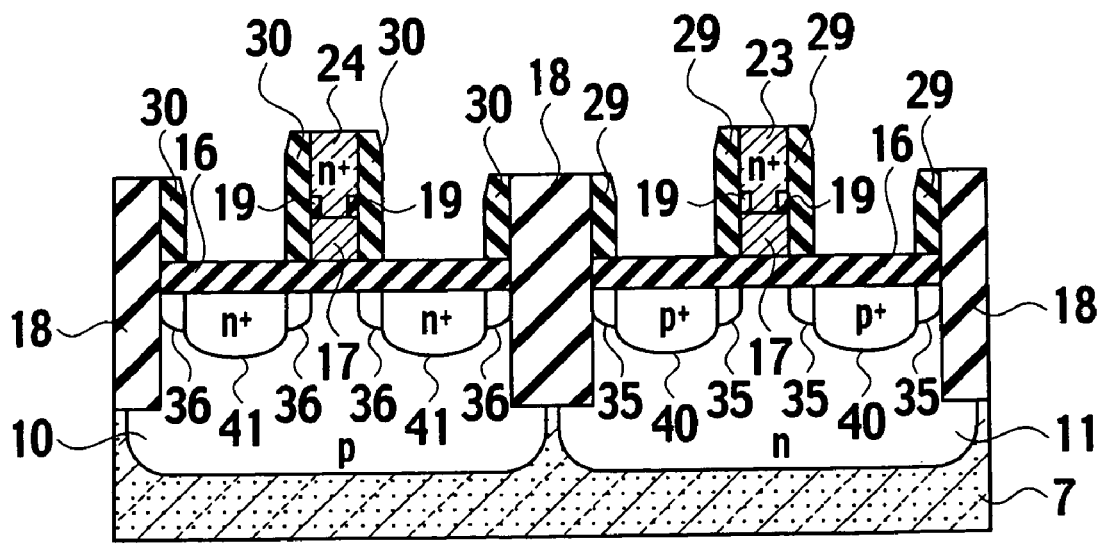
Figure 16C:
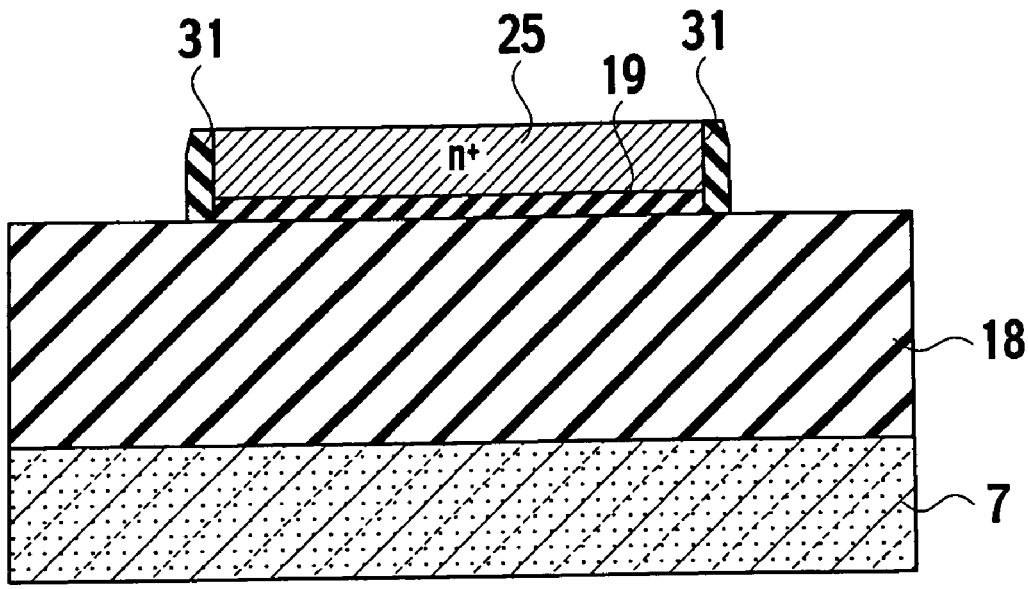
Figure 16D:
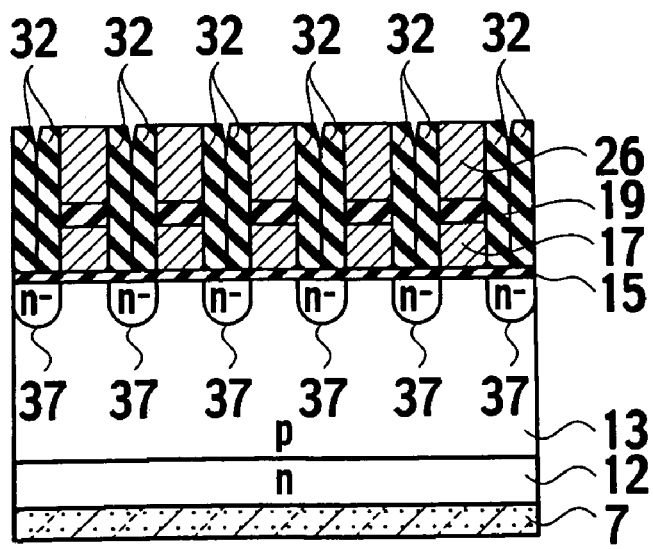
Figure 17A:
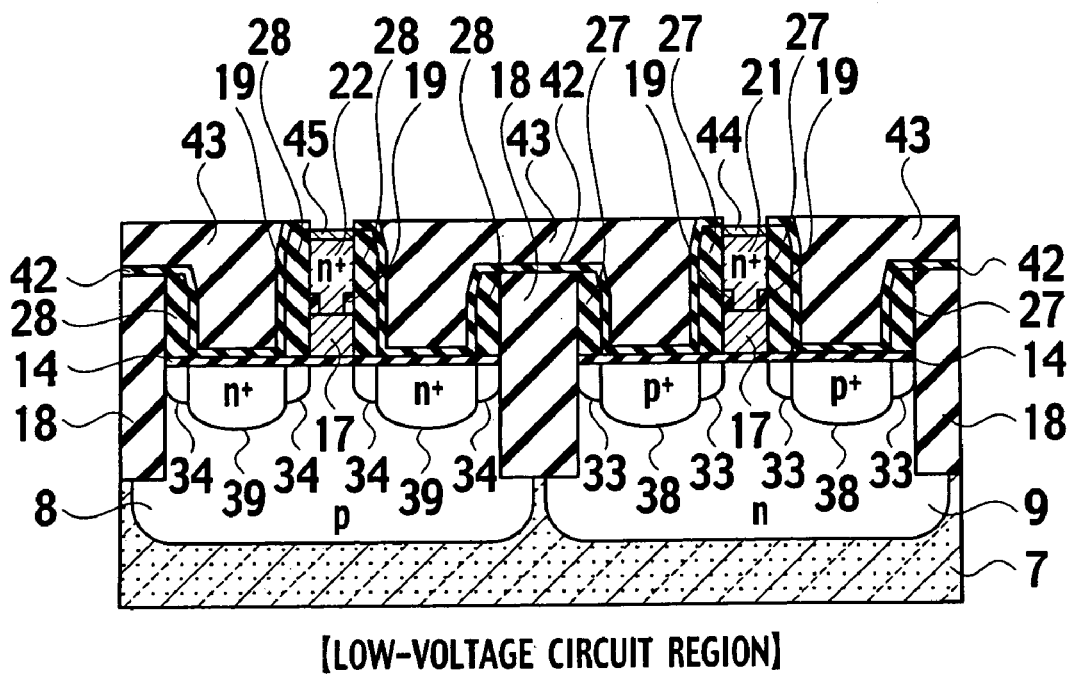
Figure 17B:
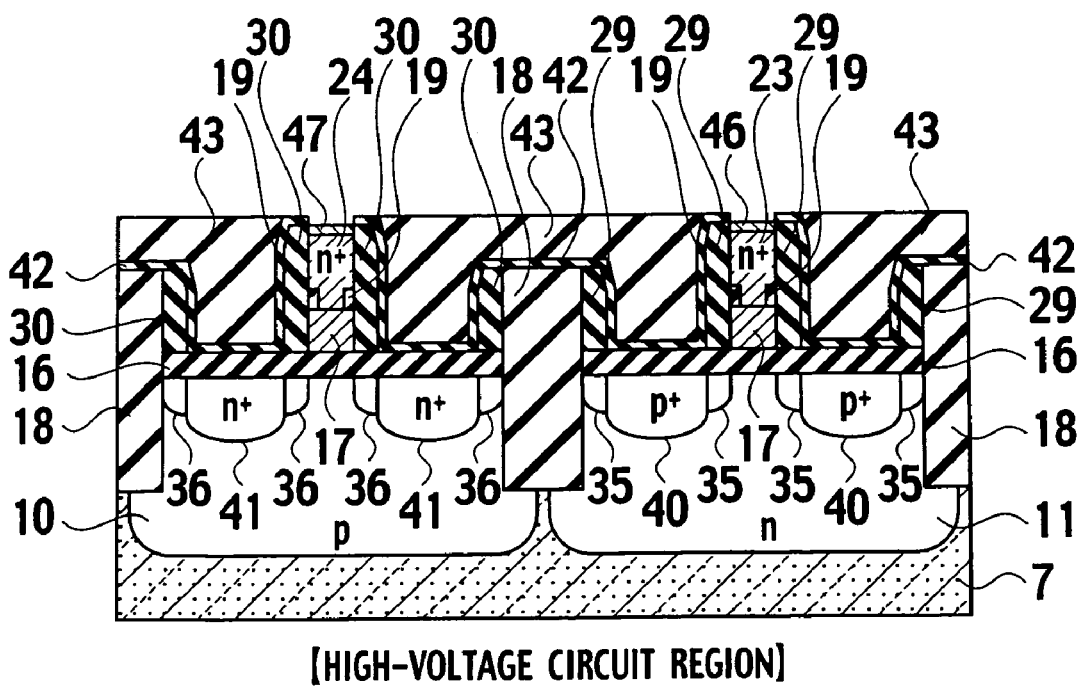
Figure 17C:
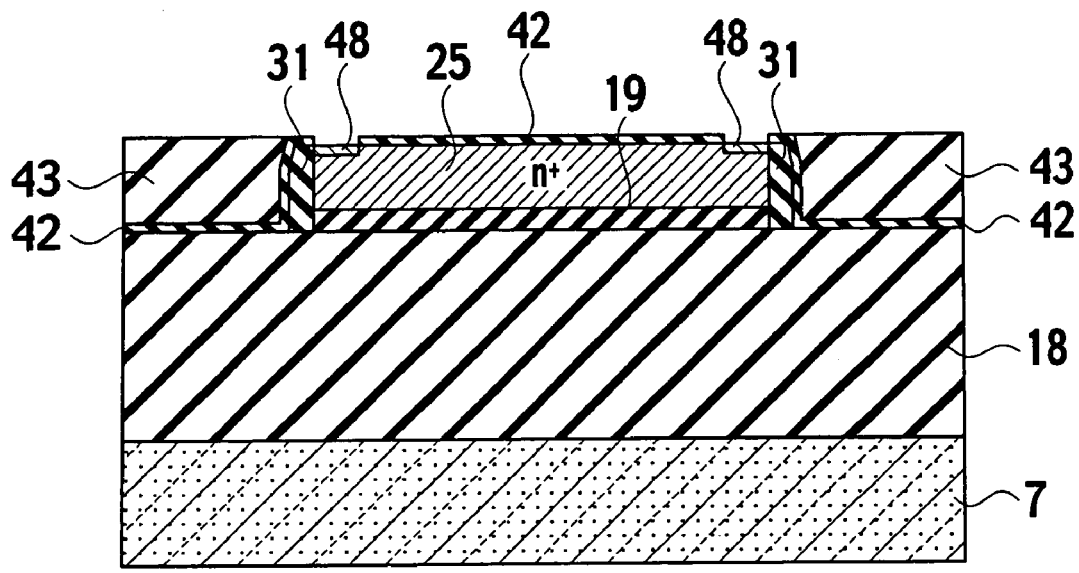
Figure 17D:
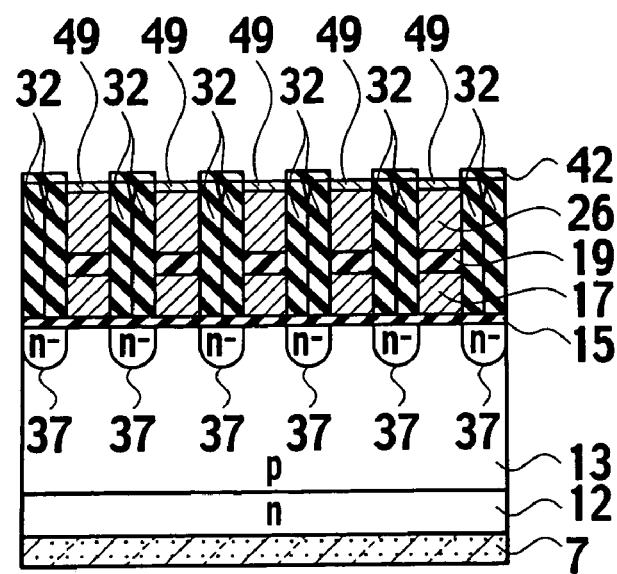

As shown in FIGS. 16A and 16B, p-type impurity ion implantation is carried out using the gate electrodes 21 and 23 of the low-voltage p-channel MIS transistor and the high-voltage p-channel MIS transistor, respectively, as a mask thereby forming the p-type light doping regions 33 and 35 in the n-wells 9 and 11 of the semiconductor substrate 7. N-type impurity ion implantation is carried out using the gate electrodes 22 and 24 of the low-voltage n-channel MIS transistor and the high-voltage n-channel MIS transistor, respectively, as a mask thereby forming the n-type light doping regions 34 and 36 in the p-wells 8 and 10 of the semiconductor substrate 7. As shown in FIG. 16C, impurity ions are not implanted in the semiconductor substrate below the n-type semiconductor 25. As shown in FIG. 16D, n-type ion implantation is carried using the control gate electrode 26 of the memory cell transistor as a mask, thereby forming the n-type semiconductor region 37 in the p-well 13 of the semiconductor substrate 7.

The insulating films 27 through 30 are formed through selective etching on sidewalls of the gate electrodes of the low-voltage transistor and the high-voltage transistor and sidewall of the device isolating film. The insulating films 27 through 30 become sidewalls of the gate electrodes of the low-voltage transistor and the high-voltage transistor. The insulating film 31 is formed through selective etching on the sidewalls of the n-type semiconductor film 25 of the resistor. The insulating film 32 is formed through selective etching on the sidewalls of the floating gate electrode 17 and the control gate electrode 26 of the memory cell transistor. Ion-implantation prevention films are not formed on the gate electrodes 21 through 24 of the low-voltage transistor and the high-voltage transistor and the control gate electrode 26 of the memory cell transistor. Normally, thickness of the ion-implantation prevention films is in a range of 200 nm or greater to 300 nm or less. The height of the top of the gate insulating films 14 and 16 or height of the gate electrodes is between 180 nm and 500 nm. Since there are no ion-implantation prevention films, there is a reduced etching burden on the mask material during the etching process for formation of the gate electrodes of the memory cell transistor, the low-voltage transistor and the high-voltage transistor. Furthermore, the tapering angle of the gate electrodes 21 through 24, the floating gate electrode 17, and the control gate electrode 26 may be easily controlled. Furthermore, the sidewalls of the gate electrodes 21 through 24, the floating gate electrode 17, and the control gate electrode 26 may be formed nearly perpendicular to the semiconductor substrate 7 or the horizontal plane. The insulating film 32 may be easily embedded between each floating gate electrode 17 and corresponding control gate electrode 26. The embedded insulating film 32 is barely etched through selective etching. The insulating films 27 through 32 are prepared to have an etch selectivity against the n-type semiconductor films 17 and 21 through 26 when etching the insulating films 27 through 32. In addition, the insulating films 27 through 32 are salicide controlling films for sidewalls of the gate electrodes with a salicide method described later.

Using the gate electrodes 21 and 23 of the low-voltage p-channel MIS transistor and the high-voltage p-channel MIS transistor, respectively, and the insulating films 27 and 29 as a mask, p-type impurity ion implantation is carried out for formation of the source and drain regions 38 and 40 so that the resulting concentration of the sum of concentration of implanted p-type impurity ions for formation of the light doping regions 33 and 35 and concentration of implanted p-type impurity ions for formation of the source and drain regions 38 and 40 is lower than that of n-type impurity ions in the n-type semiconductor films 21 and 23. As a result, p conductivity type source and drain regions 38 and 40 are formed on the respective n-wells 9 and 11 of the semiconductor substrate 7, and the gate electrodes 21 and 23 of the low-voltage p-channel MIS transistor and the high-voltage p-channel MIS transistor, respectively, remain as n-type semiconductors. In order to form the source and drain regions 38 and 40, the same concentration of the same type of impurity as in the source and drain regions 38 and 40 is implanted in the gate electrodes 21 and 23. The quantity per unit area of implanted p-type impurity or doses of the source and drain regions 38 and 40 and the gate electrodes 21 and 23 are the same. Since the concentration of the n-type impurity in the gate electrodes 21 and 23 is higher than that of the p-type impurity, even though p-type impurity and the n-type impurity are mixed in the gate electrodes 21 and 23, the gate electrodes 21 and 23 are n-type semiconductors, even if both impurities are sufficiently activated in the subsequent heat treatment.

Implantation of n-type impurity ions is carried out for formation of the source and drain regions 39 and 41 using the gate electrodes 22 and 24 of the low-type n-channel MIS transistor and the high-voltage n-channel MIS transistor and the insulating films 28 and 30 as a mask. As a result, the source and drain regions 39 and 41 of an n conductivity type are formed in the respective p-wells 8 and 10 of the semiconductor substrate 7. The gate electrodes 22 and 24 of the low-type n-channel MIS transistor remain as n-type semiconductors.

As shown in FIGS. 17A through 17D, the insulating film 42 is formed on the gate insulating films 14 and 16, which are above the device isolating film 18, the insulating films 27 through 32, the n-type semiconductor films 21 through 26, and the source and drain regions 38 through 41. The insulating film 43 is formed on the insulating film 42. The insulating films 43 may be easily embedded in the trenches above the source and drain regions 38 through 41 surrounded by the insulating film 42. This is because the tapering angle of the gate electrodes 17 and 21 through 24 may be controlled. The insulating film 43 is polished by chemical mechanical polishing (CMP) using the insulating film 42 as a stopper. The insulating film 43 is prepared so as to have a CMP polish selectivity against the insulating film 42. As a result, the insulating film 42 above the gate electrodes 21 through 24, the n-type semiconductor film 25 of the resistor, and the control gate electrode 26 is exposed. The insulating film 42 is removed from the entirety of the upper surfaces of the gate electrodes 21 through 24 and the control gate electrode 26. The insulating film 42 is removed from both ends of the upper surface of the n-type semiconductor film 25 of the resistor. The entire upper surfaces of the gate electrodes 21 through 24 and the control gate electrode 26, and both ends of the upper surface of the n-type semiconductor film 25 of the resistor are exposed. The insulating films 42 and 43 are used as metal salicide stopper films in the salicide method.

Salicide films 44 through 49 are formed on the entire upper surfaces of the gate electrodes 21 through 24 and the control gate electrode 26, and both ends of the upper surface of the n-type semiconductor film 25 of the resistor using the salicide method. In other words, metal salicide films are formed. As shown in FIGS. 2 through 11, the inter-layer insulating film 50 is formed on the insulating films 42 and 43 and the silicide films 44 through 49. Contact holes passing through the inter-layer insulating film 50 are formed on the silicide films 44 through 49. Contact plugs 51 through 56 are embedded in the contact holes.

As described above, according to the first embodiment, a nonvolatile semiconductor memory is provided having insulating films easily embedded between respective gate electrodes of a memory cell transistor, a low-voltage transistor, and a high-voltage transistor. Furthermore, a nonvolatile semiconductor memory fabrication method is provided that is capable of easily embedding insulating films between respective gate electrodes of a memory cell transistor, a low-voltage transistor, and a high-voltage transistor.

Second Embodiment

A nonvolatile semiconductor memory of the second embodiment is provided as a semiconductor chip 1 or a part thereof, as shown in FIG. 1. The nonvolatile semiconductor memory according to the second embodiment also comprises a cell array region 4, low-voltage circuit regions 2, and high-voltage circuit regions 3, as with the nonvolatile semiconductor memory of the first embodiment. Memory cell transistors are deployed in the cell array region 4. Low-voltage transistors and resistors are deployed in the respective low-voltage circuit regions 2. High-voltage transistors are deployed in the respective high-voltage circuit regions 3.

The low-voltage transistors in the low-voltage circuit regions 2 of the second embodiment have the same structure as those in the low-voltage circuit regions 2 of the first embodiment as shown in FIGS. 2 through 4.

Figure 18:
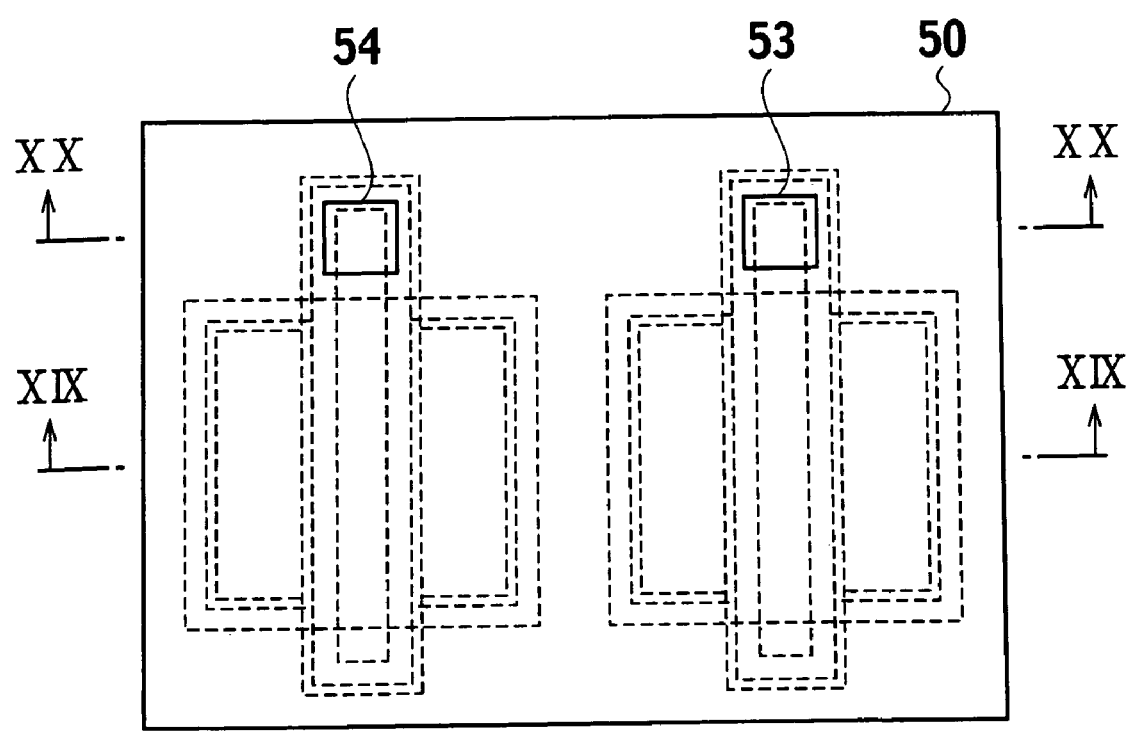
FIG. 18 is a top view of transistors in a high-voltage circuit region of nonvolatile semiconductor memory, according to a second embodiment.
Figure 19:
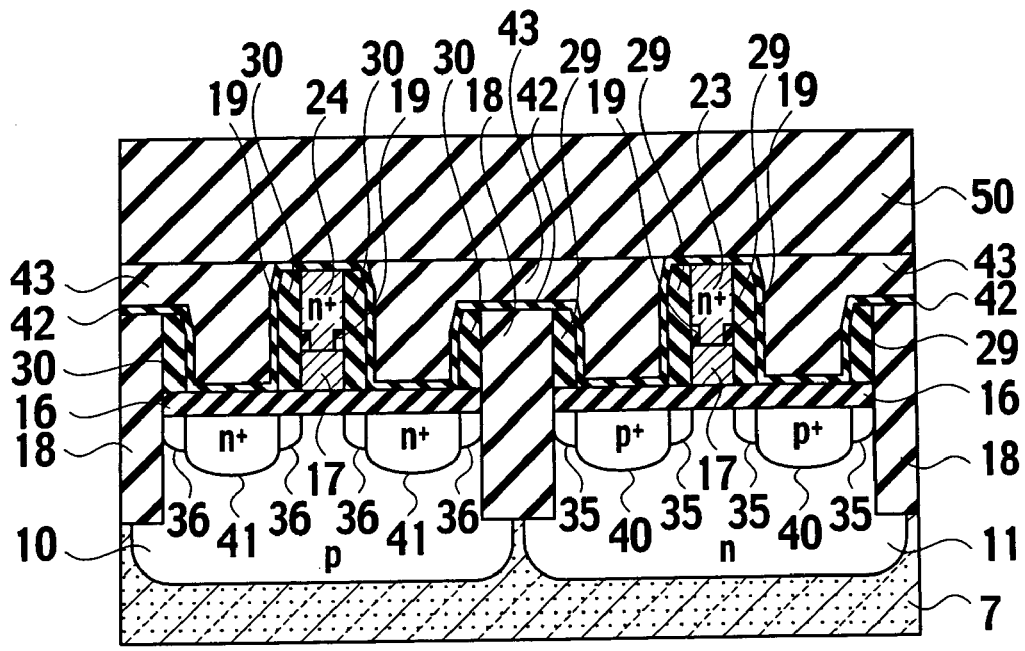
FIG. 19 is a cross section cut along a line XIX-XIX in FIG. 18.
Figure 20:
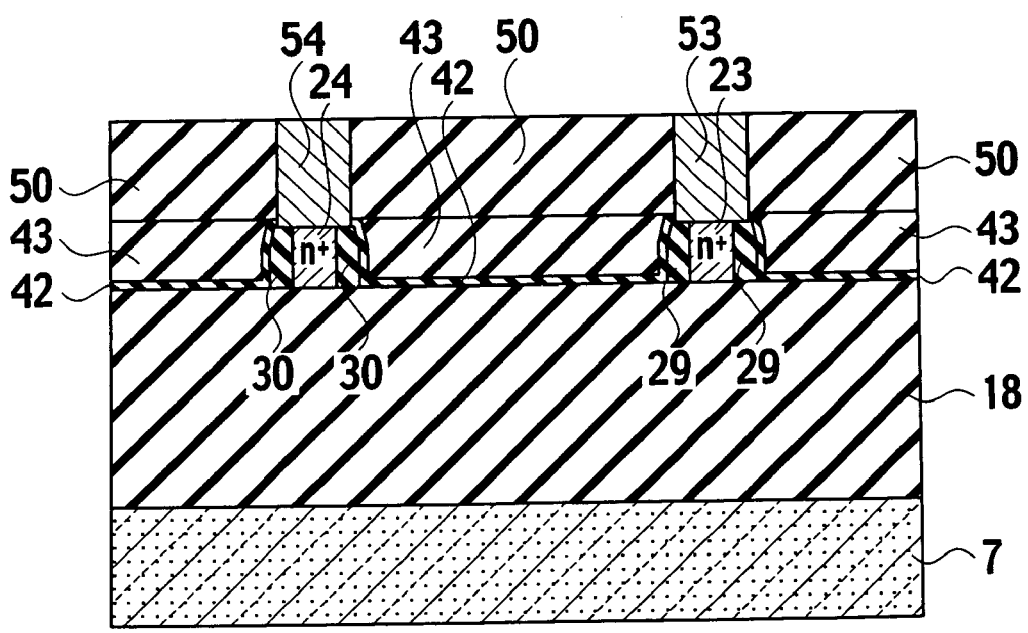
FIG. 20 is a cross section cut along a line XX-XX in FIG. 18.

As shown in FIGS. 18 through 20, the high-voltage transistors in the high-voltage circuit regions 3, according to the second embodiment, are different from those in the high-voltage circuit regions 3, according to the first embodiment, in that they do not comprise the silicide films 46 and 47. Accordingly, an insulating film 42 or salicide protective film is deployed on n-type semiconductor films 23 and 24. Contact plugs 53 and 54 are also arranged on the n-type semiconductor films 23 and 24. This provides high-voltage transistors.

Figure 21:
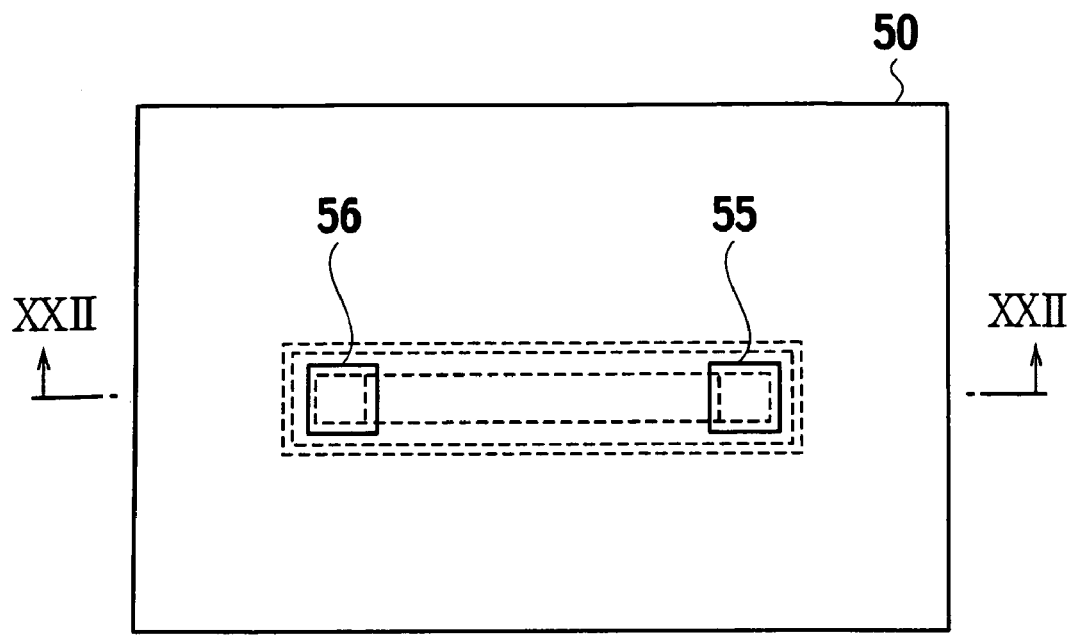
FIG. 21 is a top view of resistors in a low-voltage circuit region of the nonvolatile semiconductor memory, according to the second embodiment.
Figure 22:
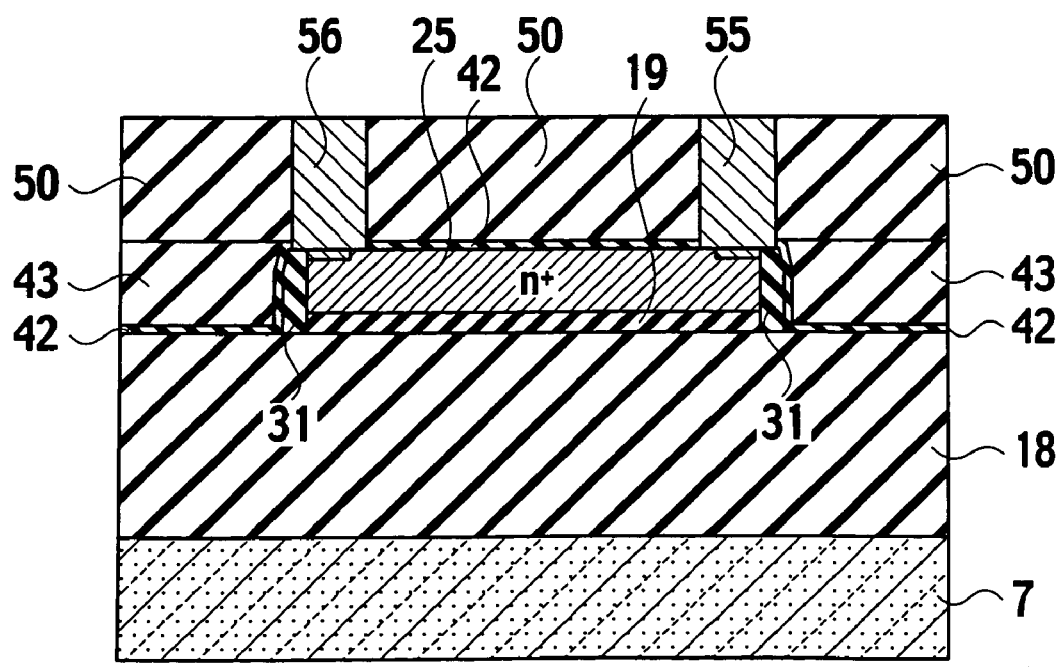
FIG. 22 is a cross section cut along a line XXII-XXII in FIG. 21.

As shown in FIGS. 21 and 22, the resistors in the low-voltage circuit regions 2, according to the second embodiment, are different from those in the low-voltage circuit regions 2, according to the first embodiment, in that they do not comprise the silicide film 48. Accordingly, contact plugs 55 and 56 are not deployed on the insulating film 42. The contact plugs 55 and 56 are deployed on the n-type semiconductor film 25 and the insulating film 31, respectively. This provides high resistance resistors.

The memory cell transistors in the cell array region 4, according to the second embodiment, have the same structure as those in the cell array region 4, according to the first embodiment as shown in FIGS. 10 and 11.

A nonvolatile semiconductor memory fabrication method according to the second embodiment is described forth with. The nonvolatile semiconductor memory fabrication method according to the second embodiment includes the same processes corresponding to FIGS. 12A through 16D of the nonvolatile semiconductor memory fabrication method according to the first embodiment.

After these processes, the insulating film 42 is formed on gate insulating films 14 and 16, which are above a device isolating film 18, insulating films 27 through 32, n-type semiconductor films 21 through 26, and source and drain regions 38 through 41, as shown in FIGS. 17A, 17D, and 18 through 22. The insulating film 43 is formed on the insulating film 42. The insulating film 43 is polished by CMP using the insulating film 42 as a stopper. The insulating film 43 is prepared to have a CMP polish selectivity against the insulating film 42. As a result, the insulating film 42 above the gate electrodes 21 through 24, the n-type semiconductor film 25 of the resistor, and the control gate electrode 26 is exposed. The insulating film 42 is removed from the entirety of the upper surfaces of the gate electrodes 21 and 22 and the control gate electrode 26. The insulating film 42 is removed from the entirety of the upper surfaces of the gate electrodes 23 through 24 and the control gate electrode 25. Lithography and selective etching are carried out for such selective removal. This selective etching is carried out with an etch selectivity of the insulating film 42 against the insulating film 43 and the n-type semiconductor films 21 through 26. The entire upper surfaces of the gate electrodes 21 and 22 and the control gate electrode 26 are exposed.

Salicide films 44, 45, and 49 are formed on the entire upper surfaces of the gate electrodes 21 and 22 and the control gate electrode 26, using the salicide method.

As shown in FIGS. 2 through 4, 10, 11, and 19 through 22, an inter-layer insulating film 50 is formed on the insulating films 42 and 43 and the silicide films 44, 45, and 49. Contact holes passing through the inter-layer insulating film 50 are formed on the silicide films 44, 45, and 49. Furthermore, contact holes passing through the insulating film 42 and the inter-layer insulating film 50 are formed on the gate electrodes 23 and 24 and on both ends of the n-type semiconductor film 25 of the resistor. Contact plugs 51 through 56 are embedded in the contact holes.

As described above, according to the second embodiment, a nonvolatile semiconductor memory is provided having insulating films easily embedded between respective gate electrodes of a memory cell transistor, a low-voltage transistor, and a high-voltage transistor. Furthermore, a nonvolatile semiconductor memory fabrication method is provided allowing insulating films to be easily embedded between respective gate electrodes of a memory cell transistor, a low-voltage transistor, and a high-voltage transistor.

Third Embodiment

A nonvolatile semiconductor memory according to the third embodiment is provided as a semiconductor chip 1 or a part thereof, as shown in FIG. 1. The nonvolatile semiconductor memory according to the third embodiment also comprises a cell array region 4, low-voltage circuit regions 2, and high-voltage circuit regions 3, as with the nonvolatile semiconductor memory of the first and the second embodiment. Memory cell transistors are deployed in the cell array region 4. Low-voltage transistors and resistors are deployed in the respective low-voltage circuit regions 2. High-voltage transistors are deployed in the respective high-voltage circuit regions 3.

Figure 23:
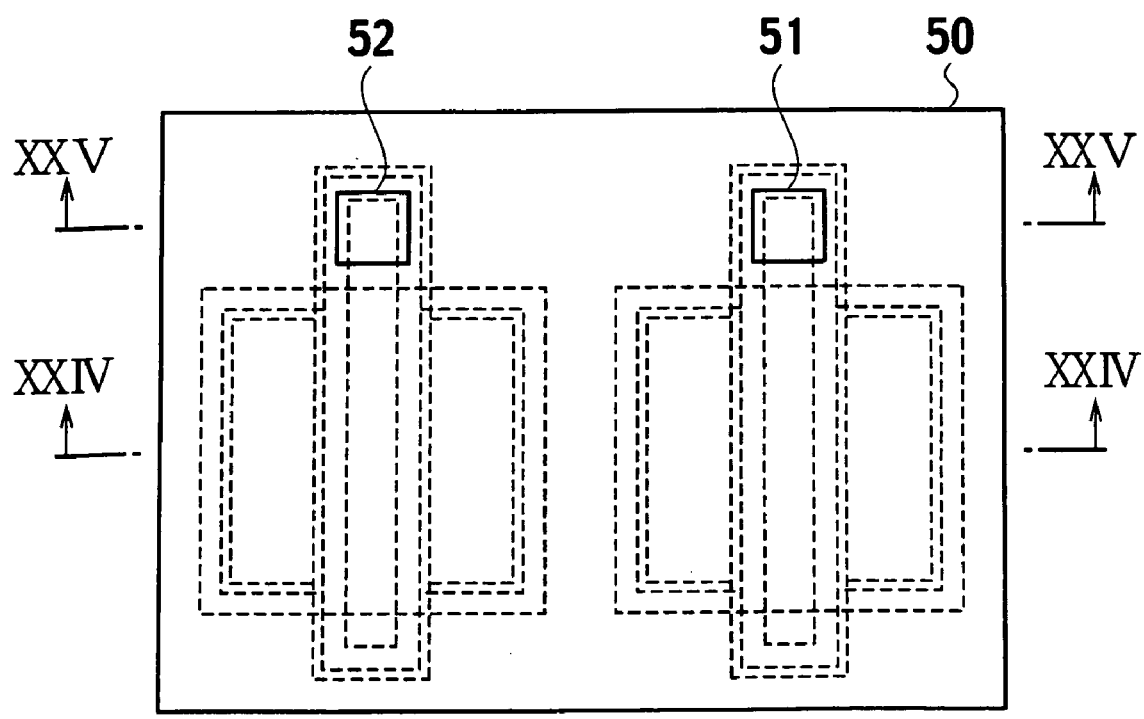
FIG. 23 is a top view of transistors in a low-voltage circuit region of nonvolatile semiconductor memory, according to a third embodiment.
Figure 24:
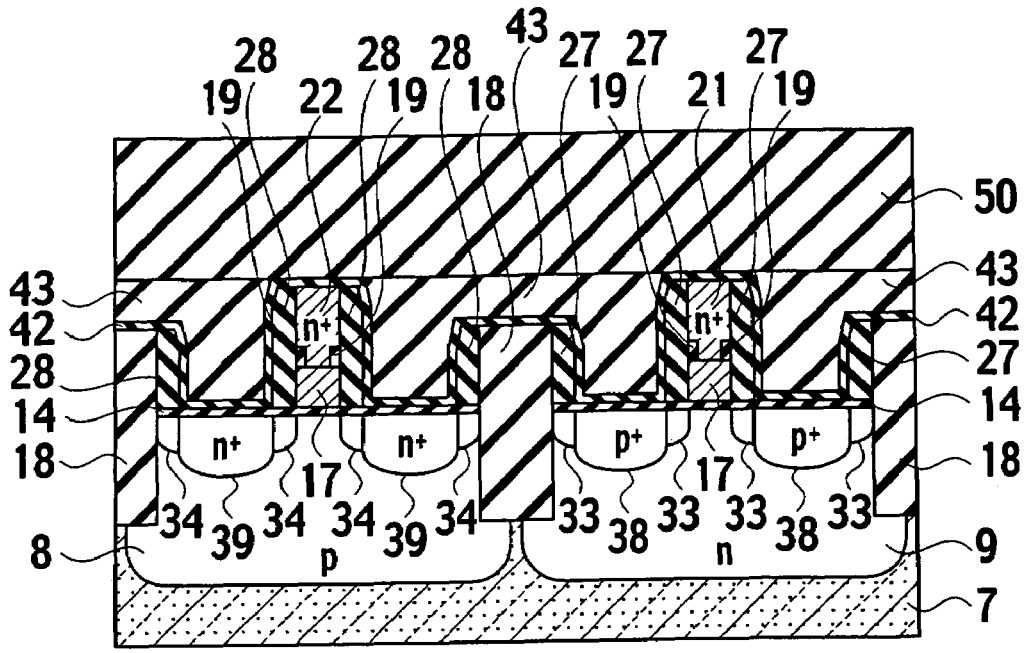
FIG. 24 is a cross section cut along a line XXIV-XXIV in FIG. 23.
Figure 25:
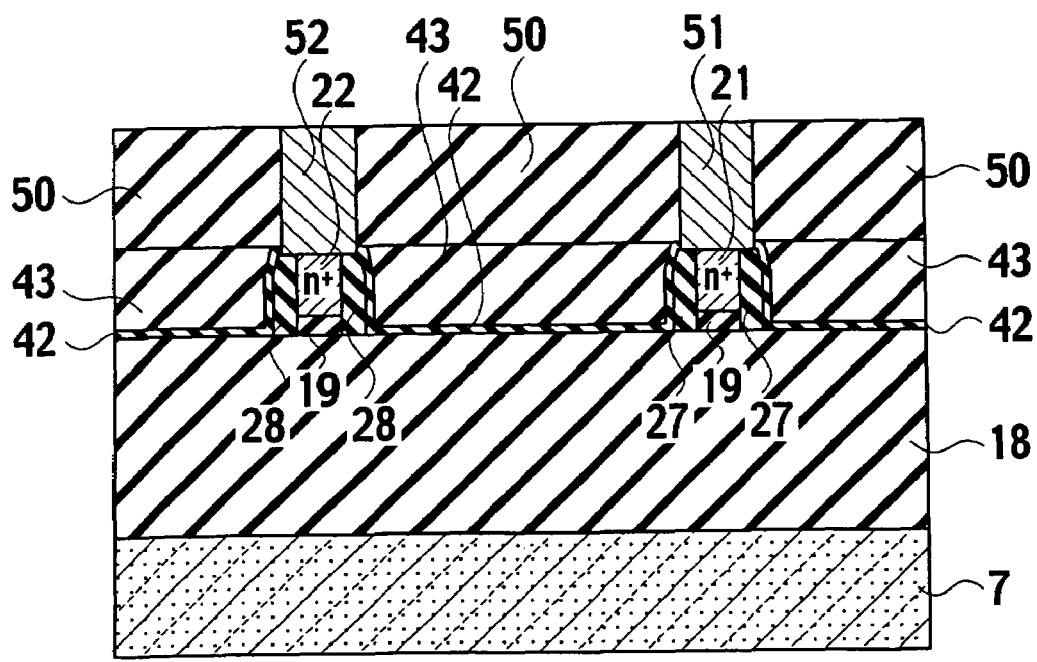
FIG. 25 is a cross section cut along a line XXV-XXV in FIG. 23.

As shown in FIGS. 23 through 25, the low-voltage transistors in the low-voltage circuit regions 2, according to the third embodiment, are different from those in the low-voltage circuit regions 2, according to the first embodiment shown in FIGS. 2 through 4, in that they do not comprise the silicide films 44 and 45. Accordingly, an insulating film 42 or salicide protective film is deployed on n-type semiconductor films 21 and 22. Contact plugs 51 and 52 are also deployed on the n-type semiconductor films 21 and 22. This provides low-voltage transistors.

The high-voltage transistors in the high-voltage circuit regions 3, according to the third embodiment, have the same structure as those in the high-voltage circuit regions 3, according to the second embodiment as shown in FIGS. 18 through 20.

The resistors in the low-voltage circuit regions 2, according to the third embodiment, have the same structure as those in the low-voltage circuit regions 2, according to the second embodiment as shown in FIGS. 21 and 22.

The memory cell transistors in the cell array region 4, according to the third embodiment, have the same structure as those in the cell array region 4, according to the first embodiment as shown in FIGS. 10 and 11.

A nonvolatile semiconductor memory fabrication method according to the third embodiment is described forthwith. The nonvolatile semiconductor memory fabrication method, according to the third embodiment, includes the same processes corresponding to FIGS. 12A through 16D of the nonvolatile semiconductor memory fabrication method, according to the first embodiment.

As shown in FIGS. 17D and 18 through 25, the insulating film 42 is formed on gate insulating films 14 and 16, which are above a device isolating film 18, insulating films 27 through 32, n-type semiconductor films 21 through 26, and source and drain regions 38 through 41. The insulating film 43 is formed on the insulating film 42. The insulating film 43 is polished by CMP using the insulating film 42 as a stopper. The insulating film 43 is prepared to have a CMP polish selectivity against the insulating film 42. As a result, the insulating film 42 above the gate electrodes 21 through 24, the n-type semiconductor film 25 of the resistor, and the control gate electrode 26 is exposed. The insulating film 42 is removed from the entire upper surface of the control gate electrode 26. The insulating film 42 on the gate electrodes 21 through 24 and the n-type semiconductor film 25 of the resistor is not removed. The entire upper surface of the control gate electrode 26 is exposed.

A salicide film 49 is formed on the entire upper surface of the control gate electrode 26, using the salicide method.

As shown in FIGS. 10, 11, and 19 through 25, an inter-layer insulating film 50 is formed on the insulating films 42 and 43 and the silicide film 49. Contact holes passing through the inter-layer insulating film 50 are formed on the silicide film 49. Furthermore, contact holes passing through the insulating films 42 and the inter-layer insulating film 50 are formed on the gate electrodes 21 through 24 and on both ends of the n-type semiconductor film 25 of the resistor. Contact plugs 51 through 56 are embedded in the contact holes.

As described above, according to the third embodiment, a nonvolatile semiconductor memory is provided having insulating films easily embedded between respective gate electrodes of a memory cell transistor, a low-voltage transistor, and a high-voltage transistor. Furthermore, a nonvolatile semiconductor memory fabrication method is provided allowing insulating films to be easily embedded between respective gate electrodes of a memory cell transistor, a low-voltage transistor, and a high-voltage transistor.

Fourth Embodiment

A nonvolatile semiconductor memory according to the fourth embodiment is provided as a semiconductor chip 1 or a part thereof, as shown in FIG. 1. The nonvolatile semiconductor memory of the fourth embodiment also comprises a cell array region 4, low-voltage circuit regions 2, and high-voltage circuit regions 3, as with the nonvolatile semiconductor memory of the first embodiment. Memory cell transistors are deployed in the cell array region 4. Low-voltage transistors and resistors are deployed in the respective low-voltage circuit regions 2. High-voltage transistors are deployed in the respective high-voltage circuit regions 3.

Figure 26:
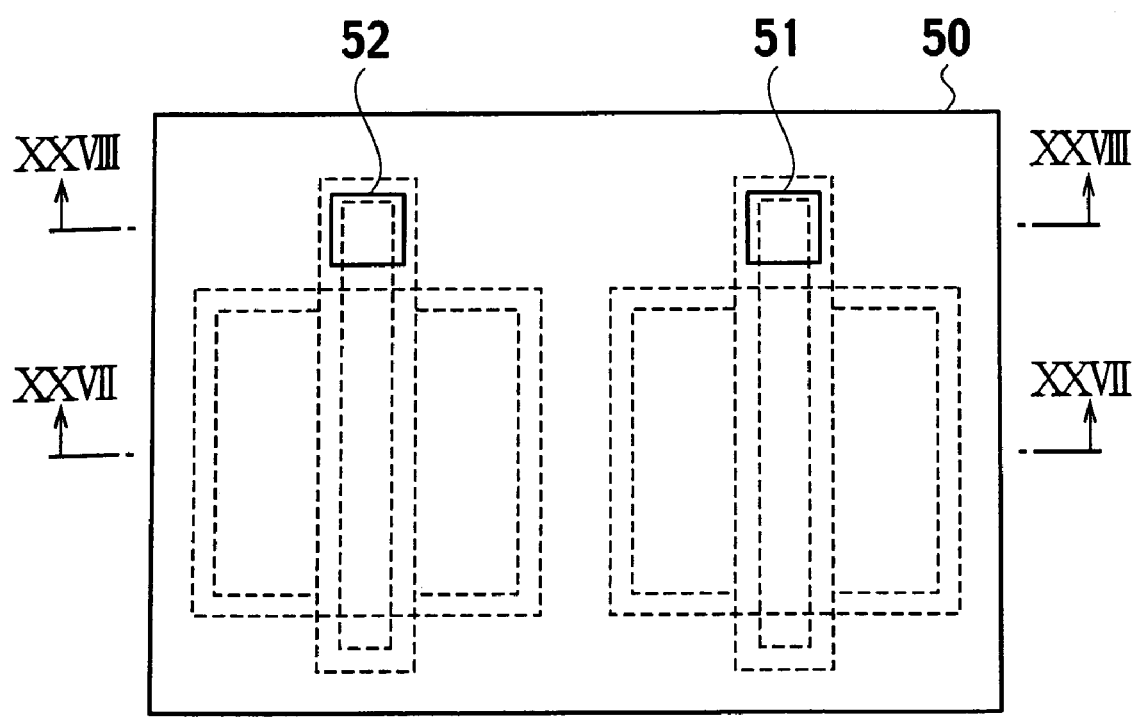
FIG. 26 is a top view of transistors in a low-voltage circuit region of nonvolatile semiconductor memory, according to a fourth embodiment.
Figure 27:
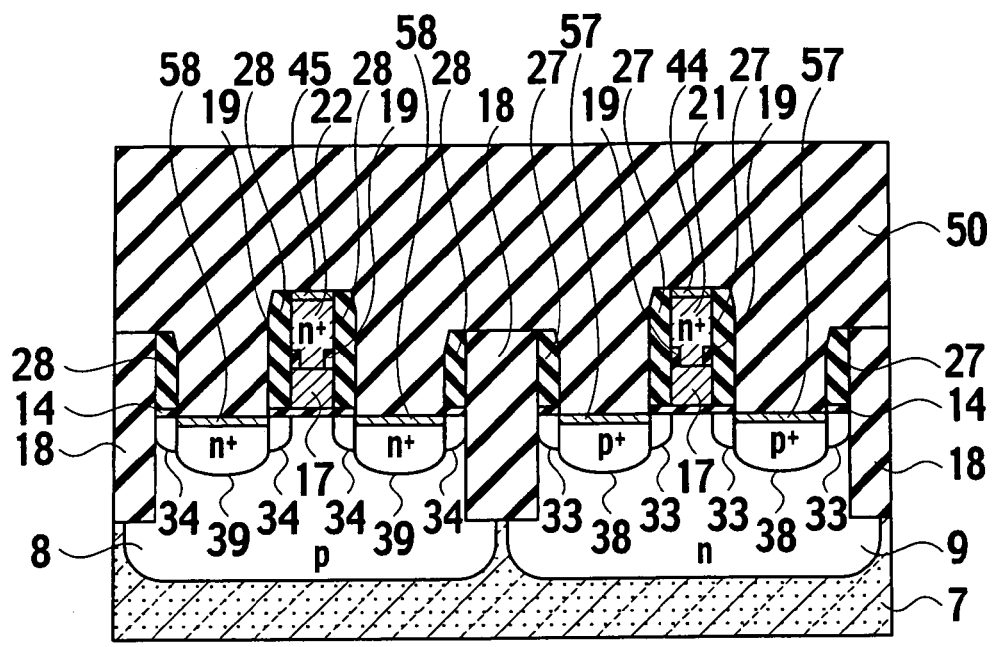
FIG. 27 is a cross section cut along a line XXVII-XXVII in FIG. 26.
Figure 28:
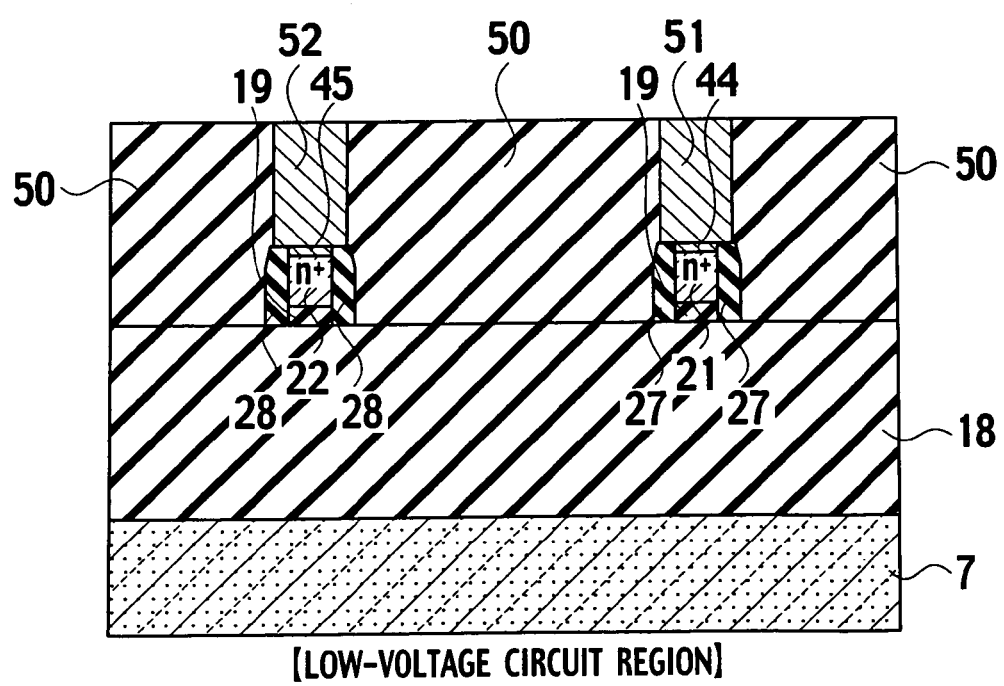
FIG. 28 is a cross section cut along a line XXVIII-XXVIII in FIG. 26.

As shown in FIGS. 26 through 28, the low-voltage transistors in the low-voltage circuit regions 2, according to the fourth embodiment, are different from those in the low-voltage circuit regions 2, according to the first embodiment shown in FIGS. 2 through 4, in that they comprise silicide films 57 and 58 on source and drain regions 38 and 39, respectively. Accordingly, insulating films 42 and 43 or salicide protective films are not deployed. This allows formation of low-voltage transistors.

Figure 29:
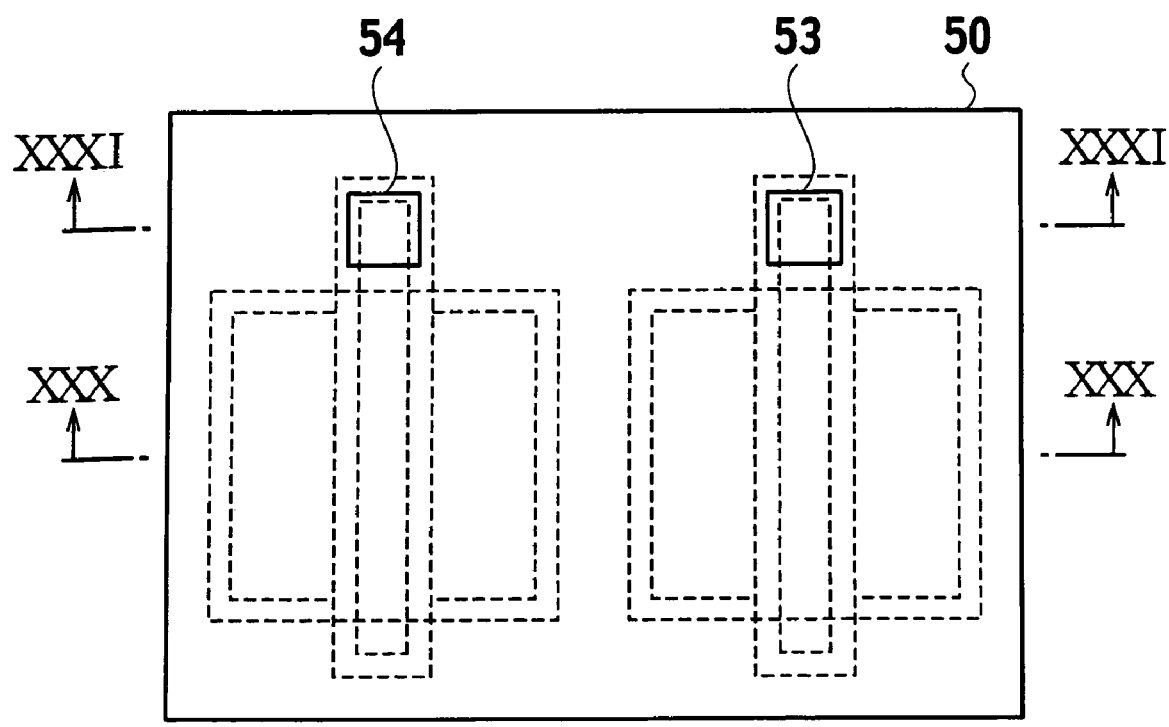
FIG. 29 is a top view of transistors in a high-voltage circuit region of the nonvolatile semiconductor memory, according to the fourth embodiment.
Figure 30:
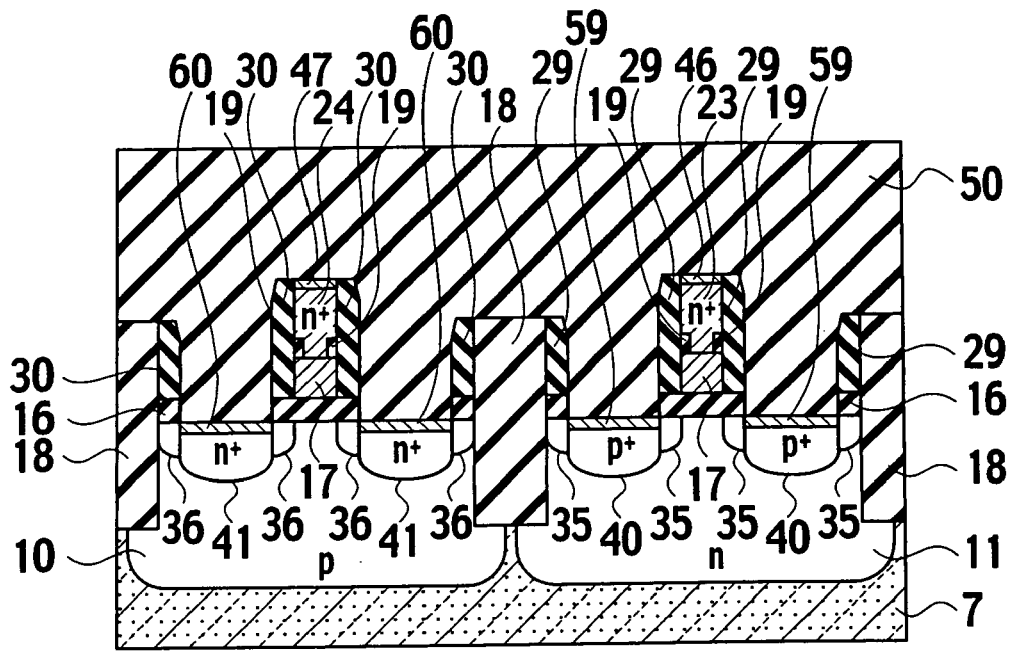
FIG. 30 is a cross section cut along a line XXX-XXX in FIG. 29.
Figure 31:
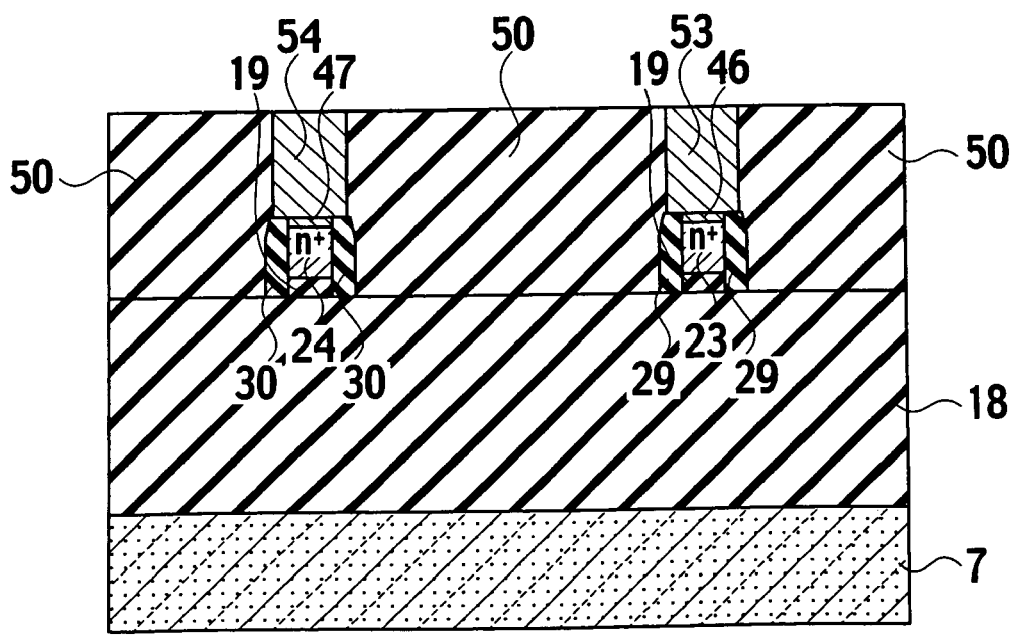
FIG. 31 is a cross section cut along a line XXXI-XXXI in FIG. 29.

As shown in FIGS. 29 through 31, the high-voltage transistors in the high-voltage circuit regions 3 according to the fourth embodiment, are different from those in the high-voltage circuit regions 3, according to the first embodiment shown in FIGS. 5 through 7, in that they comprise silicide films 59 and 60 on source and drain regions 40 and 41, respectively. Accordingly, the insulating films 42 and 43 are not deployed. This allows formation of high-voltage transistors.

Figure 32:
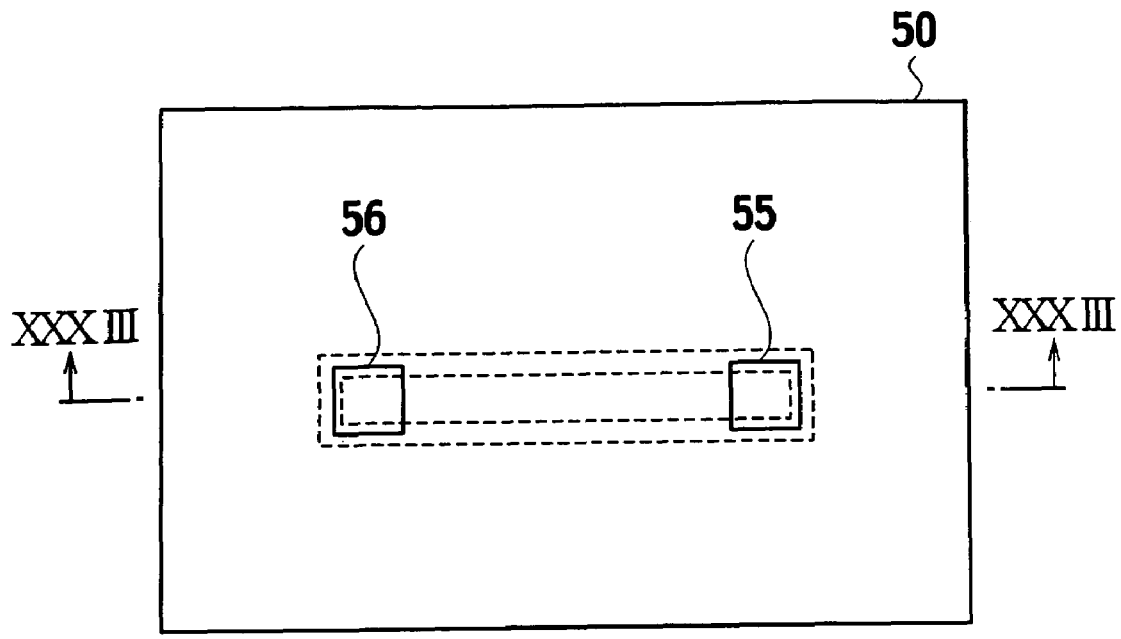
FIG. 32 is a top view of resistors in a low-voltage circuit region of the nonvolatile semiconductor memory, according to the fourth embodiment.
Figure 33:
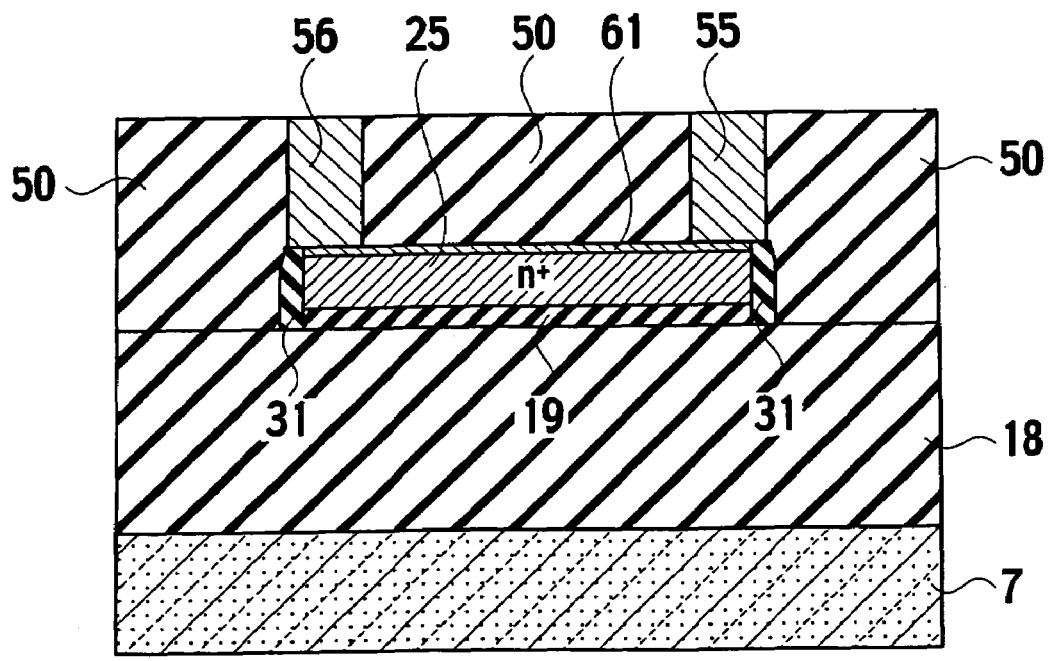
FIG. 33 is a cross section cut along a line XXXII-XXXII in FIG. 32.

As shown in FIGS. 32 and 33, the resistors in the low-voltage circuit regions 2, according to the fourth embodiment, are different from those in the low-voltage circuit regions 2, according to the first embodiment shown in FIGS. 8 and 9, in that they comprise a silicide film 61 on the entire upper surface of an n-type semiconductor 25 as well as on both ends thereof. Accordingly, the insulating films 42 and 43 are not deployed, thereby providing the resistors.

Figure 34:
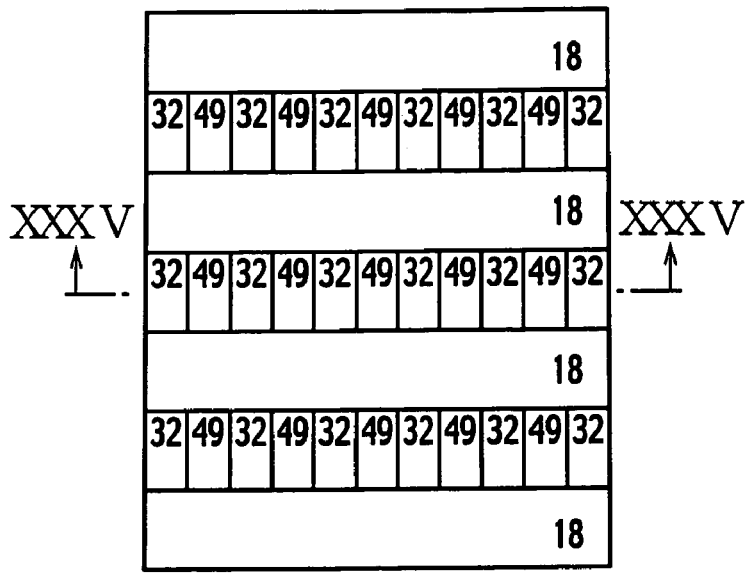
FIG. 34 is a top view of a cell array region of the nonvolatile semiconductor memory, according to the fourth embodiment.
Figure 35:
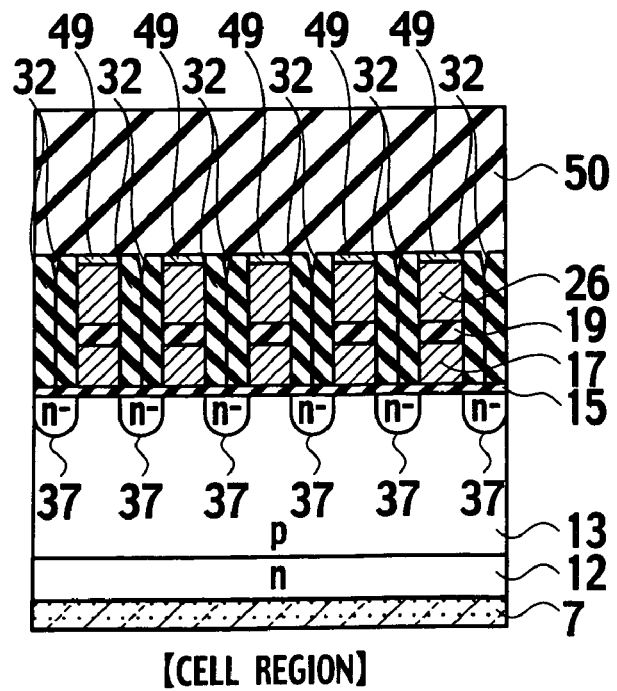
FIG. 35 is a cross section cut along a line XXXV-XXXV in FIG. 34.

As shown in FIGS. 34 and 35, the memory cell transistors in the cell array region 4, according to the fourth embodiment, comprise the same structure as those in the cell array region 4, according to the first embodiment, as shown in FIGS. 10 and 11.

A nonvolatile semiconductor memory fabrication, according to the fourth embodiment, is described forthwith. The nonvolatile semiconductor memory fabrication method, according to the fourth embodiment, includes the same processes corresponding to FIGS. 12A through 16D of the nonvolatile semiconductor memory fabrication method according to the first embodiment.

After these processes, gate insulating films 14 and 16 are etched, using gate electrodes 21 through 24 and insulating films 27 through 30 as a mask. Source and drain regions 38 through 41 are exposed. Salicide films 44 through 47, 49, and 57 through 61 are formed on the entire upper surfaces of the gate electrodes 21 through 24, a control gate electrode 26, and an n-type semiconductor film 25 of the resistor, and on the source and drain regions 38 through 41, using the salicide method.

An inter-layer insulating film 50 is formed on the device isolating film 18, the insulating films 27 through 32, and the silicide films 44 through 47, 49, and 57 through 61. Contact holes passing through the inter-layer insulating film 50 are formed on the silicide films 44 through 47. Contact holes passing through the inter-layer insulating film 50 are formed on both ends of the silicide film 61. Contact plugs 51 through 56 are embedded in the contact holes.

As described above, according to the fourth embodiment, a nonvolatile semiconductor memory is provided having insulating films easily embedded between respective gate electrodes of a memory cell transistor, a low-voltage transistor, and a high-voltage transistor. Furthermore, a nonvolatile semiconductor memory fabrication method is provided allowing insulating films to be easily embedded between respective gate electrodes of a memory cell transistor, a low-voltage transistor, and a high-voltage transistor.

Fifth Embodiment

Figure 36:
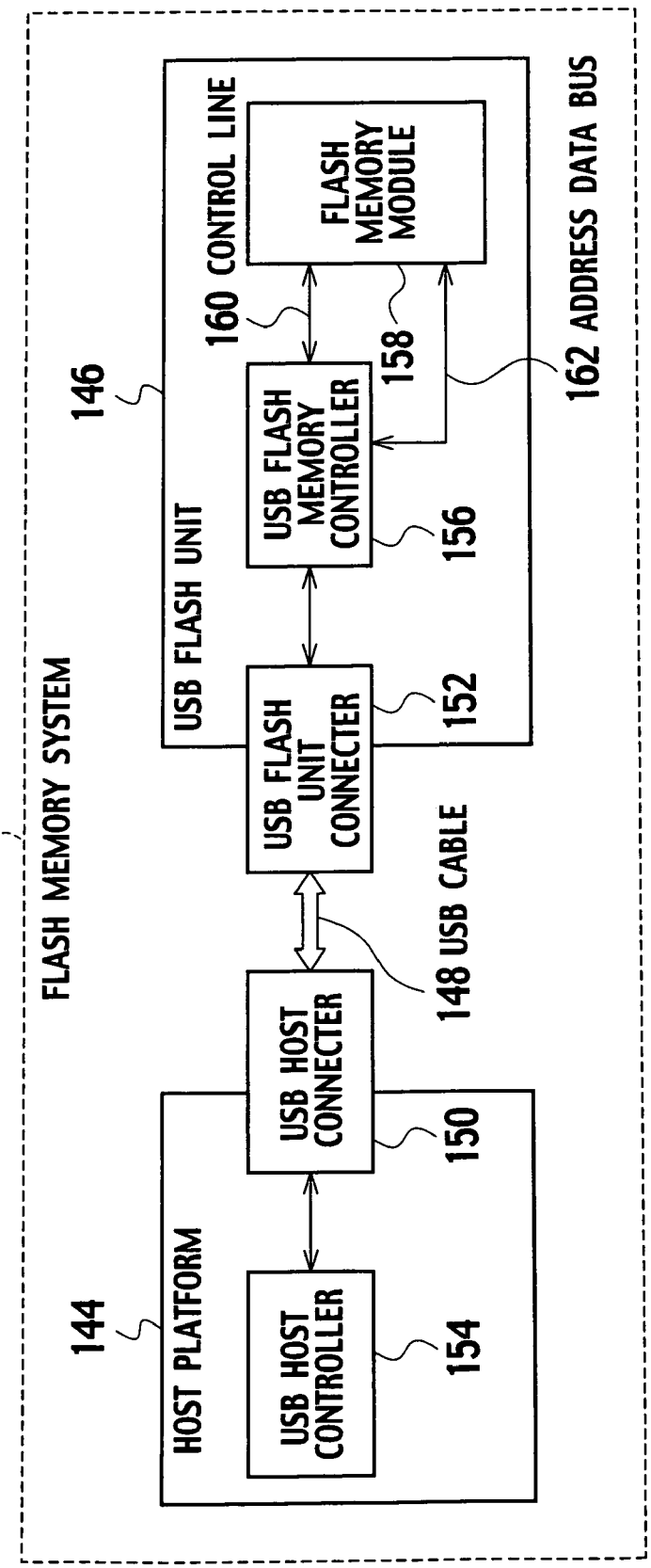
FIG. 36 is a block diagram schematically showing flash memory and a system, according to a fifth embodiment.

An application of the nonvolatile semiconductor memory, according to the first through the fourth embodiment of the present invention, is described as a fifth embodiment of the present invention. As shown in FIG. 36, a flash memory system 142, according to the fifth embodiment, comprises a host platform 144 and a universal serial bus (USB) flash unit 146.

The host platform 144 is connected to the USB flash unit 146 via a USB cable 148. The host platform 144 is connected to the USB cable 148 via a USB host connector 150, and the USB flash unit 146 is connected to the USB cable 148 via a USB flash unit connector 152. The host platform 144 comprises a USB host controller 154, which controls packet transmission through a USB bus.

The USB flash unit 146 includes a USB flash memory controller 156, which controls other elements in the USB flash unit 146 as well as controls the interface to the USB bus of the USB flash unit 146; the USB flash unit connector 152; and at least one flash memory module 158 configured with the nonvolatile semiconductor memory, according to the first through the fourth embodiment of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/ to the USB flash unit 146 via a FIFO buffer called an end point, which stores transfer data. The host platform 144 recognizes changes in the physical and electrical states, such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet to the USB cable 148. If the USB flash unit 146 is a unit including the end point that has received this requested packet, this request will be accepted by the USB flash memory controller 156.

Next, the USB flash memory controller 156 performs various operations, such as read-in, write-in or erasure of data from or to the flash memory module 158. In addition, the controller 156 supports basic USB functions, such as acquiring a USB address and the like. The USB flash memory controller 156 controls the flash memory module 158 via either a control line 160, which is used to control the output of the flash memory module 158 or other various signals, such as a chip enable signal CE, a read-out signal, or a write-in signal.

Furthermore, the flash memory module 158 is also connected to the USB flash memory controller 156 via an address data bus 162. The address data bus 162 transfers a read-out, a write-in or an erasure command for the flash memory module 158, and the address and data for the flash memory module 158.

In order to notify the host platform 144 of the results and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148 described above.

As described above, according to the fifth embodiment, a nonvolatile semiconductor memory is provided having insulating films easily embedded between respective gate electrodes of a memory cell transistor, a low-voltage transistor, and a high-voltage transistor. Furthermore, a nonvolatile semiconductor memory fabrication method is provided allowing insulating films to be easily embedded between respective gate electrodes of a memory cell transistor, a low-voltage transistor, and a high-voltage transistor.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor memory comprising:
   a semiconductor substrate;
   memory cell transistors disposed on the semiconductor substrate, each memory cell transistor comprising:
      a tunnel insulating film on the semiconductor substrate and in contact with a device isolating film,
      a floating gate electrode on the tunnel insulating film,
      a first insulating film on the floating gate electrode, and
      a control gate electrode on the first insulating film; and
   a transistor disposed on the semiconductor substrate, the transistor comprising:
      a first source region of a first conductive type and a first drain region of the first conductivity type surrounded by the device isolating film,
      a first gate insulating film between the first source region and the first drain region,
      a first conductive film on the first gate insulating film,
      a second conductive film of the second conductivity type provided on the first conductive film and having the same dose of the first conductivity type impurity as the first source region, and
      a second insulating film on the first conductive film and having a first trench penetrating the second insulating film, and the second conductive film connects to the first conductive film via the first trench.

2. The semiconductor memory of claim 1, wherein the first conductivity type is p-type.

3. The semiconductor memory of claim 1, wherein the transistor further comprises:
   a protective insulating film deployed above the first source region and the first drain region, and having openings on the entire surface of the second metal salicide film.

4. The semiconductor memory of claim 1, further comprising:
   a plurality of the transistors,
   wherein one of the transistors has the first gate insulating film thicker than that of the other transistors.

5. The semiconductor memory of claim 1, wherein the control gate electrode and the second conductive film have a salicide structure of any of titanium, cobalt and nickel.

6. The semiconductor memory of claim 1, wherein
   said memory cell transistors are disposed on the semiconductor substrate in a cell array area; and
   said transistor is disposed on the semiconductor substrate in a peripheral circuit region adjoining the cell array area.

7. A semiconductor memory comprising:
   a semiconductor substrate;
   memory cell transistors disposed on the semiconductor substrate, each memory cell transistor comprising:
      a tunnel insulating film on the semiconductor substrate and in contact with a device isolating film,
      a floating gate electrode on the tunnel insulating film,
      a first insulating film on the floating gate electrode, and
      a control gate electrode on the first insulating film; and
   transistors disposed in a circuit region, each transistor comprising:
      a first source region and a first drain region surrounded by a device isolating film,
      a first gate insulating film between the first source region and the first drain region,
      a first conductive film on the first gate insulating film,
      a second insulating film provided on the first conductive film and having a first trench penetrating the second insulating film, and
      a second conductive film on the first conductive film and the second insulating film.

8. The semiconductor memory of claim 7, wherein the second conductive film is n conductivity type and includes the same dose of the first p-type impurity as the first source region.

9. The semiconductor memory of claim 7, wherein the trench is a hole.

10. The semiconductor memory of claim 7, wherein the transistor further comprises a protective insulating film deployed above the first source region and the first drain region, and having openings above the entire surface of the second conductive film.

11. The semiconductor memory of claim 10, further comprising:
   resistors deployed in the circuit areas and provided on the device isolating film and under the protective insulating film.

12. The semiconductor memory of claim 7, further comprising:
   a plurality of the transistors,
   wherein one of the transistors has the first gate insulating film thicker than that of the other transistors.

13. The semiconductor memory of claim 7, wherein the control gate electrode and the second conductive film have a salicide structure of any of titanium, cobalt and nickel.

* * * * *